US011588240B2

(12) United States Patent
Afzal et al.

(10) Patent No.: US 11,588,240 B2
(45) Date of Patent: Feb. 21, 2023

(54) MILLIMETER-WAVE SCALABLE PLL-COUPLED ARRAY FOR PHASED-ARRAY APPLICATIONS

(71) Applicant: The Regents of the University of California, Oakland, CA (US)

(72) Inventors: Hamidreza Afzal, Davis, CA (US); Omeed Momeni, Davis, CA (US); Rouzbeh Kananizadeh, Folsom, CA (US); Razieh Abedi, Irvine, CA (US); Payam Heydari, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/496,626

(22) Filed: Oct. 7, 2021

(65) Prior Publication Data
US 2022/0109236 A1    Apr. 7, 2022

Related U.S. Application Data

(60) Provisional application No. 63/088,884, filed on Oct. 7, 2020.

(51) Int. Cl.
*H01Q 3/36* (2006.01)
*H03L 7/08* (2006.01)

(52) U.S. Cl.
CPC ............ *H01Q 3/36* (2013.01); *H03L 7/0802* (2013.01)

(58) Field of Classification Search
CPC ................................ H01Q 3/36; H03L 7/0802
See application file for complete search history.

(56) References Cited

U.S. PATENT DOCUMENTS 5,446,416 A * 8/1995 Lin .................. H03L 7/113
331/11
6,249,249 B1 * 6/2001 Obayashi ............... H01Q 3/42
342/372

(Continued)

FOREIGN PATENT DOCUMENTS

CN     108233975 A  *  6/2018  ............ H01Q 3/267
EP     0957532 B1   *  9/2002
(Continued)

*Primary Examiner* — Adam D Houston
(74) *Attorney, Agent, or Firm* — Park, Vaughan, Fleming & Dowler LLP

(57) ABSTRACT

Techniques, systems and architectures for generating desired phase shifts in a phased array to control the directions of radiation in a wide range of angles are disclosed. Particularly, phased array architectures based on novel PLL-coupled phase shifting techniques for implementation in millimeter-wave (mm-wave) and sub-terahertz (sub-THz) operations range are described. In one aspect, a phased array including an array of unit cells is disclosed. In some embodiments, each unit cell in the array of unit cells includes a dual-nested PLL that is configured to effectuate phase locking and frequency locking to a reference signal from an adjacent unit cell. Moreover, each PLL includes control circuitry that can generate a wide range of phase shifts between adjacent unit cells to facilitate phased-array operations. Note that using the dual-nested PLL to generate a desired phase shift between adjacent radiating elements eliminates the use of conventional lossy phase shifters in the phased array.

15 Claims, 16 Drawing Sheets

(56) References Cited

U.S. PATENT DOCUMENTS

| | | | |
|---|---|---|---|
| 8,711,035 B1* | 4/2014 | Alexander | G01S 3/22 |
| | | | 701/4 |
| 9,966,661 B2* | 5/2018 | Xue | H01Q 3/34 |
| 10,224,645 B2* | 3/2019 | Rao | H01Q 3/36 |
| 10,826,505 B1* | 11/2020 | Moehlmann | H03L 7/087 |
| 10,838,071 B1* | 11/2020 | Dybdal | G01S 19/30 |
| 2003/0112180 A1* | 6/2003 | Wight | H01Q 3/24 |
| | | | 455/438 |
| 2015/0229314 A1* | 8/2015 | Hata | H03L 7/0807 |
| | | | 327/199 |
| 2017/0271781 A1* | 9/2017 | Gururaja Rao | H01Q 3/36 |
| 2019/0214976 A1* | 7/2019 | Wu | H03L 7/0992 |
| 2020/0367257 A1* | 11/2020 | Hormis | H04W 72/082 |
| 2020/0403620 A1* | 12/2020 | Wang | H03L 7/20 |
| 2021/0167996 A1* | 6/2021 | Ratnam | H04L 27/2649 |
| 2022/0109236 A1* | 4/2022 | Afzal | H03L 7/0802 |
| 2022/0294683 A1* | 9/2022 | Chakraborty | H03F 3/34 |

FOREIGN PATENT DOCUMENTS

| | | | | |
|---|---|---|---|---|
| JP | H11330841 A | * | 11/1999 | |
| WO | WO-2016089460 A1 | * | 6/2016 | H01Q 3/26 |
| WO | WO-2022155721 A1 | * | 7/2022 | |

\* cited by examiner

TOPOLOGY OF AN EXEMPLARY MIXER USED IN THE DISCLOSED PLL.

MILLIMETER-WAVE SCALABLE PLL-COUPLED ARRAY FOR PHASED-ARRAY APPLICATIONS

CROSS-REFERENCE TO RELATED APPLICATION

This application claims the benefit of priority under 35 U.S.C. 119(e) to U.S. Provisional Patent Application Ser. No. 63/088,884, entitled "mm-Wave Scalable PLL-Coupled Array for Phased-Array Applications in 65-nm CMOS,", filed on 7 Oct. 2020, the contents of which are incorporated by reference herein.

GOVERNMENT LICENSE RIGHTS

This invention was made with U.S. government support under grant number 1408628 awarded by the National Science Foundation (NSF). The U.S. government has certain rights in the invention.

BACKGROUND

Field

The disclosed embodiments generally relate to the design of phased arrays. More specifically, the disclosed embodiments relate to the design of a highly stable, highly scalable phased array which utilizes a dual-nested loop PLL to generate the phase shift in place of conventional phase shifters.

Related Art

Fully-integrated silicon-based millimeter-wavelength (mm-wave)/sub-THz radiators based on multi-antenna transmitter have shown great potential for applications in high data-rate communication systems, spectroscopes, imaging/radar systems, and a variety of other electronic systems. Note that these applications often require wide frequency tuning, sufficient radiated power, and variable phase shifting between adjacent sources to perform beam steering. One solution to increase the total output power in a multi-antenna transmitter is to scale the array size. Phased array systems can potentially overcome the limited available power of the transistors at frequencies close to or beyond the maximum oscillation frequency in mm-wave radiators. Despite the proven advantages, designing phased arrays for mm-wave/sub-THz frequencies is a challenging task. Some phased array designs employed coupled individual oscillators through active or passive coupling circuits to implement coherent radiator arrays. Other phased array designs used an injection technique to provide either on-chip or off-chip reference signals for both coherent frequency multiplication and synchronization of sources. However, these coupling-based and injection-based techniques complicate the phased array design and hinder the scaling of the multi-antenna structure, causing an increase in power consumption and hence cost of the system.

Another design challenge in phased array systems is related to the high power loss/consumption caused by phase shifters at sub-THz frequencies. FIG. 1 shows a conventional phase array 100 which employs phase shifters to achieve the desired phase shift between adjacent radiating elements. As can be seen in FIG. 1, a set of phase shifters 102-1, 102-2, . . . , 102-N is used in conjunction with a set of transmitters to achieve a uniform phase shift of $\Delta\phi$ between two signals $S_i(t)$ emitted by two adjacent radiating elements. Conventional designs for phase shifters 102-1, 102-2, . . . , 102-N have used the following architectures: (1) radio frequency (RF) phase shifting architecture; (2) local oscillator (LO) phase shifting architecture; and intermediate frequency (IF) phase shifting architecture. However, each of these three types of phase shifting architecture is associated with issues and challenges.

RF and LO phase shifting architectures typically require the design of phase shifters at high frequencies, which increases both power consumption and loss. RF phase shifters also require power dividers/combiners which further add to the power consumption and the loss. In LO phase shifting architecture, coherent distribution of multiple phases to multiple front-ends has proven to be a challenging task. IF phase shifting architecture shows lower circuit losses and power consumption because of the lower frequency of operation. However, the area/size of the IF phase shifters becomes much larger, and the required mirror frequency rejection becomes a serious problem. In addition, increased inter-symbol interference (ISI) can deteriorate the system performance in IF phase shifters.

A number of techniques have been introduced to overcome the power issues presented by the phase shifters. For instance, in an injection-locked oscillator array, the uniform phase shift within a phased array was achieved by only adjusting the tuning voltage of the oscillators, thus removing the need for phase shifters. The feeding structure can also be eliminated by coupling the oscillators and injecting the output of each oscillator to its neighboring one. However, solutions involving injection-locked or coupled oscillators are generally bandwidth-limited. One way to increase the bandwidth and the achievable range of phase-shift variation is to employ frequency multipliers following each oscillator. Nonetheless, frequency multiplication adds to the complexity and essentially suffers from poor power efficiency, thus further increasing the overall power consumption. The mismatch between the simulation and measurement due to fabrication errors can result in the fluctuation in frequency and amplitude of the oscillators and leads to phase and beam-steering errors.

Hence, what is needed is a mm-wave/sub-THz power array design that does not suffer from the above-mentioned drawbacks of existing designs.

SUMMARY

Embodiments described herein provide various techniques, systems and architectures for generating desired phase shifts in a phased array to control the directions of radiation in a wide range of angles. Particularly, phased array architectures based on novel PLL-coupled phase shifting techniques for implementation in millimeter-wave (mm-wave) and sub-terahertz (sub-THz) operations range are disclosed. In some embodiments, a proposed phased array is configured to use the proposed dual-nested PLLs to generate a wide range of phase shifts between adjacent radiator elements, thereby eliminating the use of conventional lossy phase shifters in the proposed phased array.

The proposed dual-nested PLL architecture includes the two nested loops which operate coherently and concurrently to both lock the frequency and the phase, and create the required phase shift between a local VCO and a reference VCO. More specifically, the two nested loops include both a fast loop configured to enable frequency locking between two VCOs of the two adjacent radiator elements and a slow loop configured to effectuate phase locking between the two VCOs of the two adjacent radiator elements. Moreover, the fast loop and the slow loop work together to create a type-II PLL which can provide the required phase shift between the two VCOs, By eliminating the phase shifters from the phased array architecture entirely, the power loss and power consumption in the proposed phased array can be significantly reduced. As a result, the proposed phased array architecture can be used to create phased arrays of desirable sizes by simply adding more unit cells, i.e., the radiating elements in each dimension of the architecture. This up-scaling of a phased array would not be possible with conventional phase shifters because the power consumption would significantly limit the achievable power gain. In addition, in a PLL-coupled array architecture, the required phase shift can be generated by changing only an analog control voltage. Furthermore, implementation of the disclosed dual-nested PLL employs symmetrical mixer topology and differential VCOs signaling to avoid long signal routings at high-frequencies, thereby making the system scalable for mm-wave and sub-THz phased arrays with a large number of elements.

In one aspect, a phased array using a phase-locked loop (PLL)-coupled structure is disclosed. This phased array is composed of an array of unit cells, wherein each unit cell in the array of unit cells includes a radiating element such as an antenna. Each unit cell in the array of unit cells further includes a PLL having a dual-nested structure that is configured to effectuate phase locking and frequency locking to a reference signal from an adjacent unit cell in the array. Each PLL further includes a local voltage-controlled oscillator (VCO) that is phase locked and frequency locked with an adjacent VCO in an adjacent PLL in an adjacent unit cell in the array. Moreover, each PLL includes control circuitry that controls a phase shift between the local VCO and the adjacent VCO to facilitate phased-array operations.

In some embodiments, the dual-nested structure in each PLL in each unit cell includes both a fast loop that provides frequency locking between the local VCO and the adjacent VCO and a slow loop that provides phase locking between the local VCO and the adjacent VCO.

In some embodiments, the slow loop includes adjustable delay circuitry that generates the phase shift between the local VCO and the adjacent VCO based on a control voltage. Note that using the adjustable delay circuitry in the dual-nested PLL to generate the phase shift eliminates the use of a conventional lossy phase shifter in the unit cell.

In some embodiments, the slow loop includes a mixer that is coupled between the local VCO and the adjacent VCO, and that functions as a phase/frequency detector to measure a phase difference between the local VCO and the adjacent VCO.

In some embodiments, the mixer is designed to have a symmetrical topology for receiving differential signals from both the local VCO and the adjacent VCO, thereby avoiding long signal routings to the mixer at high operating frequencies.

In some embodiments, the phased array further includes a reference VCO coupled to the array of unit cells to provide a frequency reference for all unit cells in the array of unit cells based on an external DC control signal that controls the reference VCO.

In some embodiments, the array of unit cells includes a two-dimensional array of unit cells.

In some embodiments, the two-dimensional array of unit cells includes a first row of unit cells arranged along an X-direction. Moreover, each unit cell in the first row of unit cells receives a first control voltage (i.e., an X-steering control) that controls a first phase shift between a first VCO of a first PLL and a second VCO of a second PLL within a pair of adjacent unit cells in the first row of unit cells. Note that the first phase shift determines a first radiation angel for the radiating elements in the first row of unit cells in the X-direction.

In some embodiments, the first control voltage is applied to the adjustable delay circuitry within each of the first row of unit cells.

In some embodiments, the two-dimensional array of unit cells additionally includes a second row of unit cells arranged along the X-direction so that the first and second rows of unit cells are substantially parallel to each other. Moreover, the first row of unit cells and the second row of unit cells are coupled through a coupling unit cell located at an end of the second row of unit cells.

In some embodiments, each unit cell in the first row of unit cells and a corresponding unit cell in the second row of unit cells are aligned along a Y-direction perpendicular to the X-direction. Moreover, the coupling unit cell receives a second control voltage (i.e., an Y-steering control) which controls a second phase shift between the first row of unit cells and the second row of unit cells. Note that the second phase shift determines a second radiation angel for the radiating elements in both the first and second rows of unit cells in the Y-direction.

In some embodiments, the second control voltage is applied to the adjustable delay circuitry within the coupling unit cell.

In some embodiments, each unit cell other than the coupling unit cell in the second row of unit cells receives the first control voltage which determines the first radiation angel for the second row of unit cells in the X-direction.

In some embodiments, unit cells in the array of unit cells are continuously coupled to each other through the respective PLL of each unit cell in the array of unit cells, and the continuously-coupled PLLs in the array of unit cells form a PLL-coupled structure.

In another aspect, a dual-nested phase-locked loop (PLL) is disclosed. This dual-nested PLL includes a fast loop operable to lock the frequency of a local voltage-controlled oscillator (VCO) to the frequency of a reference signal. This fast loop further includes the local VCO and a phase detector configured to detect and generate a phase difference between the local VCO and the reference signal. The dual-nested PLL also includes a slow loop operable to lock the phase of the local VCO to the phase of the reference signal. This slow loop also includes the local VCO and the phase detector. The slow loop additionally includes a phase-error-processing module configured to generate a phase control signal based on the detected phase difference. More specifically, the phase control signal is used to adjust a control voltage of the local VCO to correct a residual phase error between the local VCO and the reference signal. Note that the fast loop is nested in the slow loop.

In some embodiments, the fast loop is a type-I PLL that enables fast frequency locking between the local VCO and the reference signal.

In some embodiments, the fast loop is configured to use a high-frequency component in the detected phase difference to adjust the control voltage of the local VCO to quickly lock the frequency of the local VCO to the frequency of the reference signal.

In some embodiments, the fast loop further includes circuitry operable to pass the high-frequency component while blocking a DC component in the detected phase difference.

In some embodiments, the slow loop further includes a low pass filter configured to pass the DC component while blocking the high-frequency component in the detected phase difference. Note that this DC component is associated with the residual phase error.

In some embodiments, the phase-error-processing module further includes: (1) a first delay component configured to convert the received residual phase error into a first phase delay in a second reference signal; (2) a second delay component configured to receive and convert a phase control signal into a second phase delay in the second reference signal; (3) a phase-frequency detector (PFD) coupled to both the first delay component and the second delay component to convert a difference between the first phase delay and the second phase delay into an error signal; and (4) a charge pump coupled to the PFD to convert the error signal into the phase control signal.

In some embodiments, the slow loop operates to force the received residual phase error to be equal to the received phase control signal, thereby causing the phase control signal to become a constant.

In some embodiments, the phase-error-processing module uses the first and second delay components, the PFD, and the charge pump to perform pulse width modulation (PWM) on the second reference signal, such that the phase control signal has a pulse width proportional to the difference between the first and the second phase delays.

In some embodiments, the second reference signal is a square wave received by both the first delay component and the second delay component as a respective input signal. Moreover, the frequency of the second reference signal is optimized to effectuate sufficiently fast phase locking while keeping the slow loop stable.

In some embodiments, the phase control signal is configured to cause a predetermining phase shift between the local VCO and the reference signal when the local VCO is locked to the reference signal.

In some embodiments, the phase-error-processing module replaces a conventional PFD/charge pump block in the dual-nested PLL to facilitate high frequency operations.

In some embodiments, the slow loop operates concurrently with the fast loop to form a type-II PLL.

In some embodiments, the slow loop has an infinite DC loop gain.

In yet another aspect, a PLL-coupled architecture for phased array applications is disclosed. This PLL-coupled architecture includes a chain of continuously-coupled PLLs, wherein each PLL in the chain of continuously-coupled PLLs includes a local VCO. Moreover, the local VCO in each PLL is coupled to and phase-locked and frequency-locked with an adjacent local VCO in an adjacent PLL in the chain of continuously-coupled PLLs. Furthermore, each PLL includes control circuitry that controls a phase shift between the local VCO and the adjacent local VCO to facilitate phased-array operations.

In some embodiments, each PLL has a dual-nested structure that is configured to effectuate phase locking and frequency locking to a reference signal from the adjacent local VCO.

In some embodiments, the dual-nested structure in each PLL includes: (1) a fast loop that provides frequency locking between the local VCO and the adjacent local VCO; and (2) a slow loop that provides phase locking between the local VCO and the adjacent VCO.

In some embodiments, the chain of continuously-coupled PLLs receives a common control signal that is coupled to the control circuitry in each PLL in the chain of continuously-coupled PLLs to control the phase shift.

In some embodiments, the slow loop includes adjustable delay circuitry that generates the phase shift between the local VCO and the adjacent local VCO based on the common control signal.

DETAILED DESCRIPTION

Figure 1:
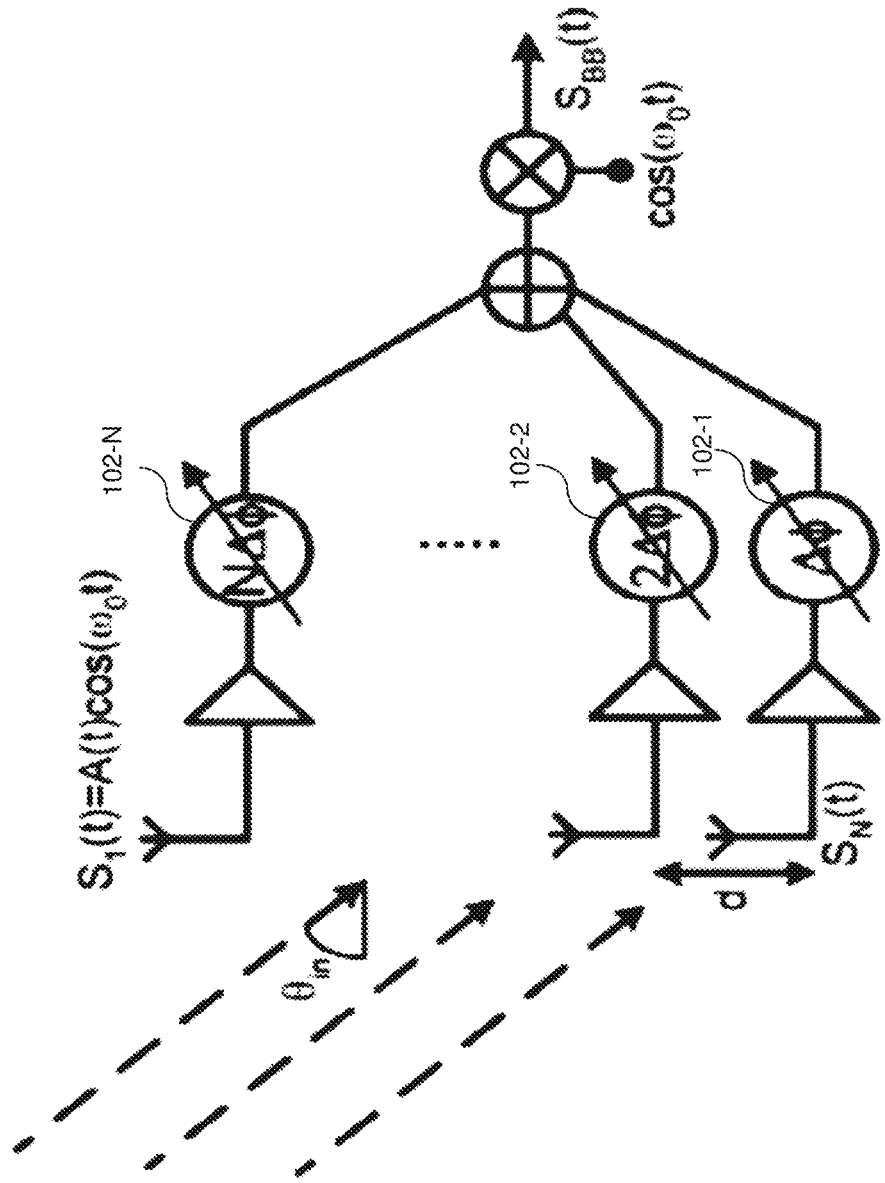
FIG. 1 shows a conventional phase array which employs phase shifters to achieve the desired phase shift between adjacent radiating elements.

The following description is presented to enable any person skilled in the art to make and use the disclosed embodiments, and is provided in the context of one or more particular applications and their requirements. Various modifications to the disclosed embodiments will be readily apparent to those skilled in the art, and the general principles defined herein may be applied to other embodiments and applications without departing from the scope of those that are disclosed. Thus, the present invention or inventions are not intended to be limited to the embodiments shown, but rather are to be accorded the widest scope consistent with the disclosure.

This disclosure provides various techniques, systems and architectures for generating desired phase shifts in a phased array to control the directions of radiation in a wide range of angles. Particularly, phased array architectures based on novel phase-locked-loop-coupled (PLL-coupled) phase shifting techniques for implementation in millimeter-wave (mm-wave) and sub-terahertz (sub-THz) operations range are disclosed. In some embodiments, a proposed phased array is configured to use the proposed dual-nested PLLs to generate a wide range of phase shifts between adjacent radiator elements, thereby eliminating the use of conventional lossy phase shifters in the proposed phased array.

The proposed dual-nested PLL architecture includes the two nested loops which operate coherently and concurrently to both lock the frequency and the phase, and create the required phase shift between a local voltage-controlled oscillator (VCO) and a reference VCO. More specifically, the two nested loops include both a fast loop configured to enable frequency locking between two VCOs of the two adjacent radiator elements; and a slow loop configured to effectuate phase locking between the two VCOs of the two adjacent radiator elements. Moreover, the fast loop and the slow loop work together to create a type-II PLL which can provide the required phase shift between the two VCOs, By eliminating the phase shifters from the phased array architecture entirely, the power loss and power consumption in the proposed phased array can be significantly reduced. As a result, the proposed phased array architecture can be used to create phased arrays of desirable sizes by simply adding more unit cells, i.e., the radiating elements in each dimension of the architecture. This up-scaling of a phased array would not be possible when conventional phase shifters are used because the power consumption would significantly limit the achievable power gain. In addition, in PLL-coupled array architecture, the required phase shift can be generated by changing only an analog control voltage. Furthermore, implementation of the disclosed dual-nested PLL employs symmetrical mixer topology and differential VCOs signaling to avoid long signal routings at high-frequencies, thereby making the system scalable for mm-wave and sub-THz phased arrays with a large number of elements.

As mentioned in the background section, conventional phased-array designs using phase shifters for beam-steering/scanning suffer from power losses and high power consumptions issues. Injection-locked or coupled oscillators techniques for phased array designs offered phase shift solutions without using phase shifters, but nonetheless suffer from issues such as narrow locking range and phase fluctuation that lead to beam-steering errors. To mitigate the problems of phase fluctuation and error, a phase-shift technique referred to as coupled phase-locked loop (PLL) has been proposed.

Figure 2:
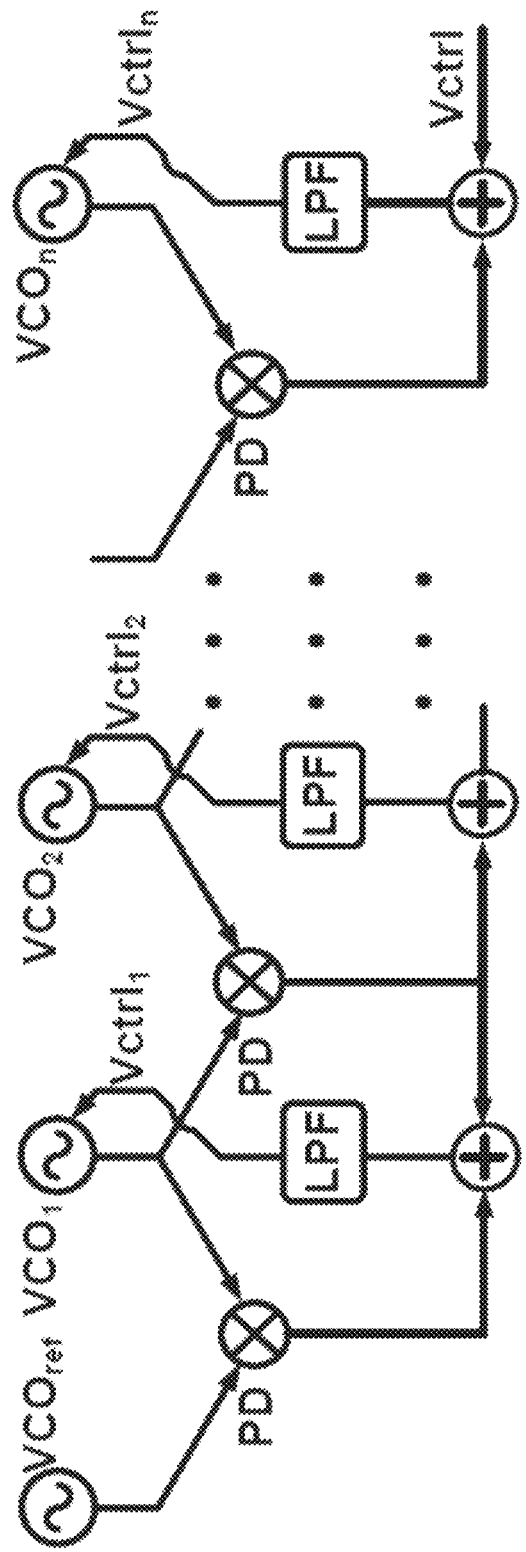
FIG. 2 shows a block diagram of a coupled-phase-locked loop (PLL) array which can be used for phase shifting and beam steering in a phased array.

FIG. 2 shows a block diagram of a coupled-PLL array 200 that can be used for phase shifting and beam steering in a phased array. In the architecture of FIG. 2, voltage-controlled oscillators (VCOs) are locked to a reference VCO ($VCO_{ref}$) and a control voltage, $V_{ctrl}$ is used to generate an equal phase shift between the adjacent VCOs. This coupled PLL technique can achieve wider phase-shift-variation and locking ranges than the aforementioned injection-locked and coupled oscillator arrays and at the same time reduce the phase fluctuations and beam-steering errors. However, as can be observed from FIG. 2, the PLLs in coupled PLL array 200 use conventional phase detectors (PDs), which are intended to operate in low frequencies. Indeed, designing a wide-band PLL with its VCO, PD, and frequency-divider blocks all operating over a wide band at mm-wave/sub-THz frequencies can be extremely difficult. As such, the coupled PLL array 200 are not suitable for mm-wave/sub-THz frequency operations. Hence, there is a motivation to create a new PLL architecture which can be used in a coupled-PLL array for mm-wave/sub-THz frequency operations.

Figure 3:
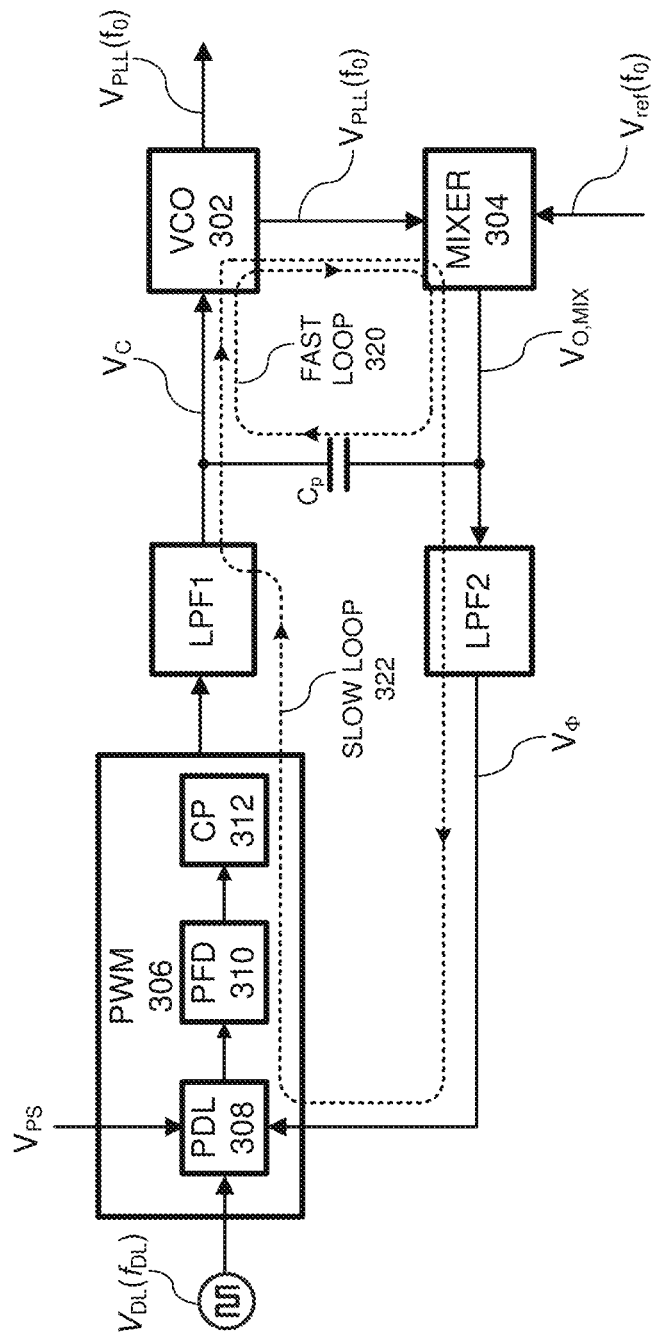
FIG. 3 shows the block diagram of a proposed dual-nested PLL 300 for use in a PLL-coupled array in accordance with some embodiments.

FIG. 3 shows the block diagram of a proposed dual-nested PLL 300 for use in a PLL-coupled array in accordance with some embodiments. As can be seen in FIG. 3, PLL 300 includes a VCO 302, a mixer 304, a first low pass filter LPF1, a second low pass filter LPF2, and a proposed pulse width modulation (PWM) module 306, all of the above modules are coupled to each other in the manner shown. Note that in the architecture of the proposed PLL 300, PWM module 306 takes the place of either a conventional phase-frequency detector (PFD)/charge pump (CP) block or a conventional phase detector (PD)/charge pump (CP) block to generate VCO control signals. As shown in FIG. 3, the proposed PWM module 306 further includes a phase delay module (PDL) 308, a phase-frequency detector (PFD) 310, and a charge pump (CP) 312, which are coupled and functioning in the sequence as shown. As will be described in more detail below, by using the proposed PWM module 306 to generate desired phase shift in place of traditional PFD/CP or PD/CP blocks, the proposed dual-nested PLL 300 can be used in a PLL-coupled array in place of conventional PLLs to enable mm-wave/sub-THz frequency operations.

Note that dual-nested PLL 300 receives a reference input signal $V_{ref}(f_0)$ from the bottom right and outputs a stable voltage signal $V_{PLL}(f_0)$ from VCO 302. In some embodiments, the proposed dual-nested PLL 300 operates to lock both the frequency and phase of VCO 302 output $V_{PLL}(f_0)$ to the frequency and phase of reference input $V_{ref}(f_0)$. Moreover, the proposed dual-nested PLL 300 is also configured to generate a predetermined amount of phase shift between $V_{PLL}(f_0)$ and $V_{ref}(f_0)$. When dual-nested PLL 300 is used to construct a PLL-coupled structure and/or the proposed phased-array structures as described below, reference input $V_{ref}(f_0)$ is typically the output voltage from a reference VCO adjacent to VCO 302, wherein VCO 302 and the reference VCO reside respectively within two adjacent unit cells in a proposed phased array. In these applications, VCO 302 is referred to as the slave VCO with respect to the reference VCO, and VCO 302 and reference VCO are identical VCOs. Note that the proposed dual-nested PLL 300 can be used in applications other than the phased arrays. When used in other applications, input signal $V_{ref}(f_0)$ can be received from other types of VCOs and other types of PLLs different from dual-nested PLL 300 and VCO 302.

Note that input signal $V_{ref}(f_0)$ is first received by mixer 304, which simultaneously receives output $V_{PLL}(f_0)$ of VCO 302. Note that mixer 304 functions as a phase detector and measures the phase difference between reference signal $V_{ref}(f_0)$ and $V_{PLL}(f_0)$. In some embodiments, both signals $V_{ref}(f_0)$ and $V_{PLL}(f_0)$ are differential signals. Mixer 304 outputs a voltage signal $V_{O,MIX}$ which is a function of both the phase difference between $V_{ref}(f_0)$ and $V_{PLL}(f_0)$, and a sensitivity of mixer 304. Design of mixer 304 is described below in more detail.

Note that the proposed dual-nested PLL 300 includes two distinct loops, namely, a fast loop 320 and a slow loop 322, wherein the fast loop 320 in "nested" inside slow loop 322. For this reason, the proposed PLL 300 is referred to as a dual-nested PLL. A unique feature of dual-nested PLL 300 is that fast loop 320 and slow loop 322 work collectively to lock the frequency and phase of $V_{PLL}(f_0)$ to the reference signal $V_{ref}(f_0)$.

More specifically, fast loop 320 operates to quickly lock the frequency of $V_{PLL}(f_0)$ to the frequency $f_0$ of reference signal $f_0$. In some embodiments, fast loop 320 is composed of VCO 302 and mixer 304. As mentioned above, mixer 304 functions as a phase detector and measures the phase difference between $V_{PLL}(f_0)$ and $V_{ref}(f_0)$. In some embodiments, mixer 304 can include an internal LPF which is used to filter AC signals to some extent. Note that fast loop 320 also includes a capacitor $C_p$ that is coupled between an output of mixer 304 and the control input to VCO 302. Capacitor $C_p$ can be configured to block the DC component in the mixer's output $V_{O,MIX}$ while allowing the high-frequency component in the mixer's output $V_{O,MIX}$ to pass through. The value of $C_p$ can be selected based on the operation frequency of PLL 300. In some embodiments, a higher $C_p$ value can generally improve the overall PLL performance. While the specific embodiment of dual-nested PLL 300 uses capacitor $C_p$ to perform the high-pass filter (HPF) function, other embodiments of a HPF, e.g., an active HPF can be used in place of capacitor $C_p$ to perform the intended functionality in fast loop 320 and dual-nested PLL 300 without departing from the scope of the present disclosure.

In fast loop 320, as the loop is locking, the phase change is rapid and therefore results in a high-frequency component from the mixer 304's output. This high-frequency component of the mixer's output signal $V_{O,MIX}$, which results from the phase difference between $V_{PLL}(f_0)$ and $V_{ref}(f_0)$ is fed to and used to adjust the tuning voltage $V_C$ of VCO 302 through capacitor $C_p$. As mentioned above, capacitor $C_p$ in the fast loop also blocks the slow moving/DC component $V_\Phi$ in the mixer's output signal $V_{O,MIX}$. Fast loop 320 behaves as a type-I PLL to achieve rapid frequency locking by coarse-tuning the tuning voltage $V_C$. However, due to the limited loop gain of fast loop 320, a residual phase error between $V_{PLL}(f_0)$ and $V_{ref}(f_0)$ remains when the frequency locking is complete. At this point, slow loop 322 operates to bring the residual phase error to zero by fine-tuning the tuning voltage $V_C$ of VCO 302.

As can be seen in FIG. 3, slow loop 322 comprises VCO 302, mixer 302, both low pass filters LPF1, LPF2, and PWM module 306, which further includes PDL 308, PFD 310, and CP 312. Mixer 304 output $V_{O,MIX}$ passes through LPF2, which eliminates high-frequency components in mixer's output $V_{O,MIX}$. As a result, the DC component of $V_{O,MIX}$ is kept, which is shown as $V_\Phi$ in FIG. 3. $V_\Phi$ is directly coupled to PDL 308 to control an amount of phase delay generated by a group of delay cells inside PDL 308. Slow loop 322 begins to correct a phase error between two delay paths in PDL 308 by fine-tuning the tuning voltage $V_C$ of VCO 302. After a number of iterations, the residual phase error is corrected and forced to zero as a result of an inherent infinite DC loop gain of slow loop 322.

As can be seen in FIG. 3, PWM module 306 in the proposed dual-nested PLL 300 is configured to receive a phase shift control signal Vps. Similarly to $V_\Phi$, $V_{PS}$ is directly coupled to PDL 308 to control an amount of phase delay generated by another group of delay cells inside PDL 308. As will be described in more detail below in conjunction with the proposed PLL-coupled array and the proposed phased array systems, $V_{PS}$ (which becomes $V_{steer}$) in conjunction with $V_\Phi$ can be used to change a phase shift between VCO 302 output $V_{PLL}$ and reference VCO input $V_{ref}$. However, if a phase shift between $V_{PLL}$ and $V_{ref}$ is not required, $V_{PS}$ can be set to any voltage value and the proposed dual-nested PLL 300 can perform the conventional PLL function of locking $V_{PLL}$ to reference input $V_{ref}$.

In some embodiments, the proposed dual-nested PLL 300 additionally receives a control clock signal $V_{DL}$ (which is received by PDL 308 in PWM module 306) to control an optimal operating speed of slow loop 322 to lock the phase. Note that if slow loop 322 works too fast, the loop can become unstable and unable to lock the phase. On the other hand, if slow loop 322 works too slowly, it will take a long time for slow loop 322 to settle and lock the phase. Note that slow loop 322 by itself is generally not stable. However, the stability of slow loop 322 is achieved when slow loop 322 works in parallel with fast loop 320. When both loops operate concurrently, slow loop 322 becomes a type-II PLL which is capable of locking both phase and frequency. In conclusion, fast loop 320 rapidly locks the frequency of $V_{PLL}(f_0)$ with $V_{ref}(f_0)$, whereas slow loop 322 corrects the phase difference between the $V_{PLL}(f_0)$ with $V_{ref}(f_0)$.

Figure 4:
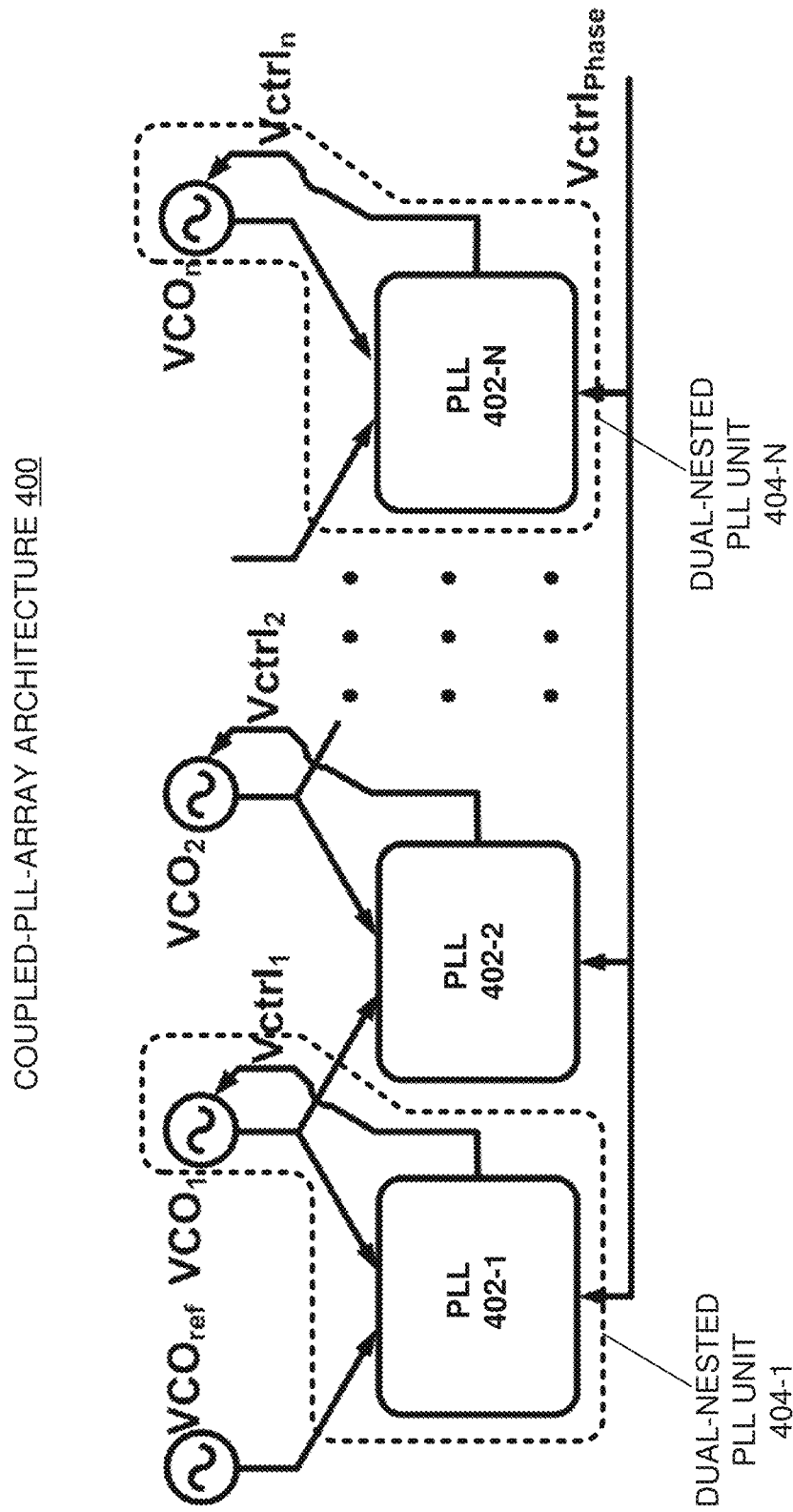
FIG. 4 shows a block diagram of a PLL-coupled-array architecture 400 which employs the proposed dual-nested PLL 300 in accordance with some embodiments.

Note that the proposed dual-nested PLL 300 can be used in a PLL-coupled array inside a phased-array system to perform the phase shifting functionalities. FIG. 4 shows a block diagram of a PLL-coupled-array architecture 400 which employs the proposed dual-nested PLL 300 in accordance with some embodiments. As can be seen in FIG. 4, PLL-coupled array 400 includes a row of coupled PLLs, namely PLL 402-1, PLL 402-2, . . . , PLL 402-N. In particular, each of the N PLLs 402-$i$ ($i$=1 to N) is implemented with the proposed dual-nested PLL 300 described in conjunction with FIG. 3, but without VCO 302. Instead, the VCO associated with each PLL 402-$i$ is shown in PLL-coupled array 400 directly coupled to PLL 402-$i$ and the adjacent PLL 402-($i$+1). For example, $VCO_1$, which is the local VCO for PLL 402-1, is coupled to both PLL 402-1 and PLL 402-2. Similarly, $VCO_2$, which is the local VCO for PLL 402-2, is coupled to both PLL 402-2 and PLL 402-3, and so on. As such, each PLL 402-$i$ and its associated VCO, form unit of the proposed dual-nested PLL 300, e.g., dual-nested PLL unit 404-1 and PLL unit 404-N encapsulated inside respective dashed-line boxes. Each of the dual-nested PLL unit 404-$i$ ($i$=1 to N) further receives a reference input signal from the adjacent $VCO_{i-1}$ inside the adjacent dual-nested PLL unit 404-($i$-1), except for the first dual-nested PLL unit 404-1, which receives its reference input signal from an independent reference source $VCO_{ref}$.

Note that compared with coupled-PLL array 200, PLL-coupled-array architecture 400 replaces each PLL unit in coupled-PLL array 200 with the disclosed dual-nested PLL 300. Moreover, each dual-nested PLL unit 404-$i$ in PLL-coupled-array architecture 400 receives a common phase shift control signal $V_{ctrl\_phase}$. This represents another distinction between PLL-coupled array 400 and PLL-coupled array 200, wherein the latter does not include a common control signal for all PLL units. Note that PLL-coupled-array architecture 400 can be used to implement a constant phase shift among an array of circuit elements, such as an array of radiator elements. We will now describe using the disclosed PLL-coupled-array architecture 400 and the disclosed dual-nested PLL 300 to implement various phased array designs suitable for mm-wave/sub-THz frequency operations. In these implementations, the common control signal $V_{ctrl\_phase}$ becomes the common beam-angel control signals $V_{steer,x}$ and $V_{steer,x}$.

Figure 5:
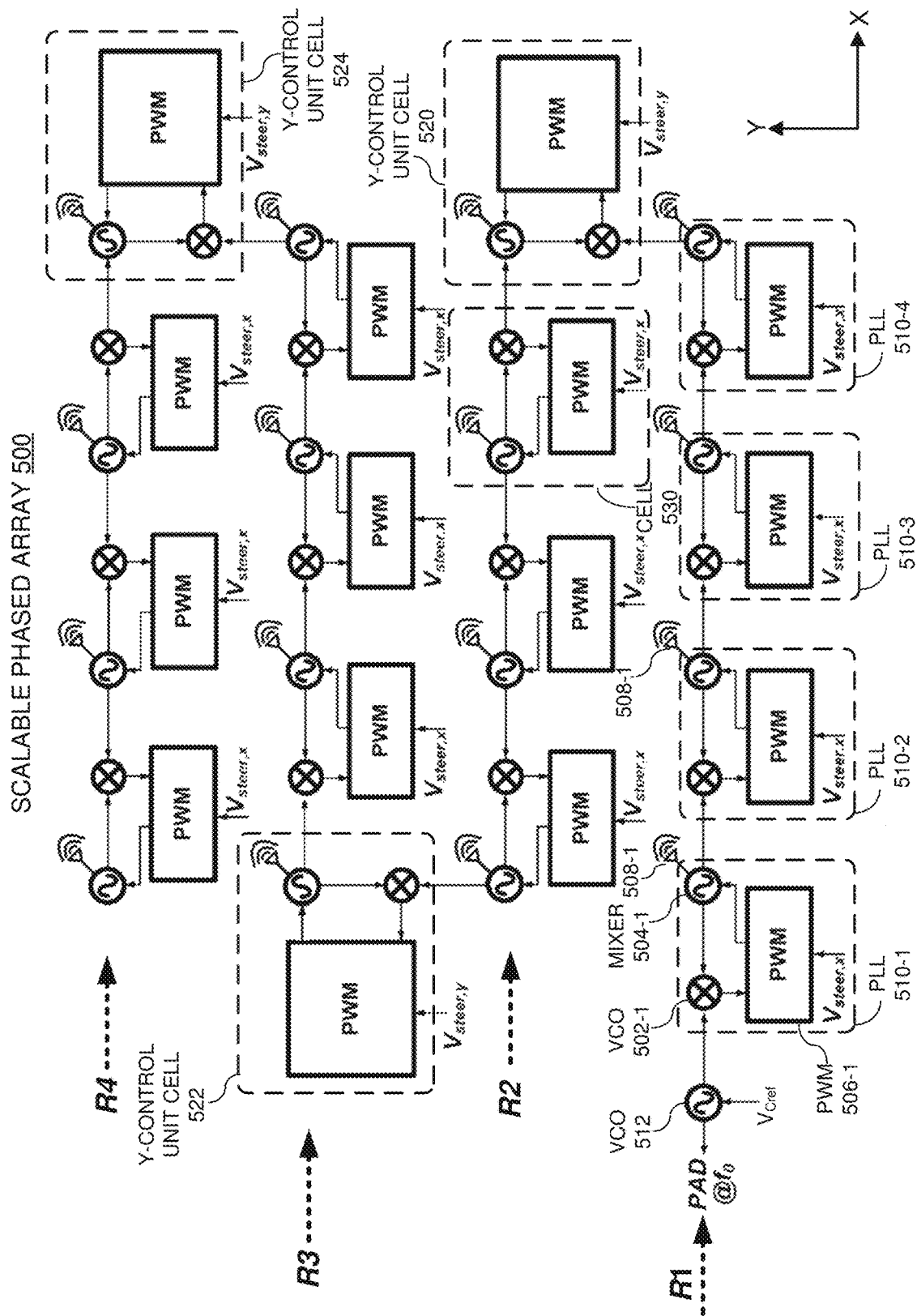
FIG. 5 presents a proposed scalable phased array implemented with the proposed PLL-coupled phase shifter in accordance with some embodiments.

FIG. 5 presents a proposed scalable phased array 500 implemented with the proposed PLL-coupled phase shifter in accordance with some embodiments. As can be seen in FIG. 5, phased array 500 is composed of a network (e.g., 4×4) of independently radiating elements (also referred to as "unit cells," or "cells" hereinafter). As shown in FIG. 5, a single radiating element/unit cell in the proposed scalable phased array 500 is further composed of a VCO 502, a mixer 504, a pulse width modulator (PWM) 506, and an antenna 508. For example, the radiating element at the bottom left of phased array 500 is composed of VCO 502-1, a mixer 504-1, PWM 506-1, and antenna 508-1, etc. Note that collectively VCO 502, mixer 504, and PWM 506 inside each radiating element/unit cell can be implemented with the proposed dual-nested PLL 300, which is referred to as PLL 510-1, PLL 510-2, PLL 510-3, etc. inside each dashed-line boxes in array 500. In the proposed phased array 500, an external control voltage $V_{Cref}$, which is a DC signal, is used to set the frequency of reference VCO 512, and as such, determining the frequency for all other VCOs in phased array 500 and the overall operation frequency of phased array 500. Depending on the target application, reference VCO 512 of phased array 500 can be locked by a separate traditional PLL to reduce the variations in the operation frequency.

Note that the proposed phased array 500 has implemented the proposed PLL-coupled-array architecture 400 described in conjunction with FIG. 4. More specifically, each VCO inside a given unit cell inside the proposed phased-array 500 is phase/frequency locked to the neighboring VCO inside the adjacent unit cell using the proposed PLL architecture of the given unit cell. In other words, each dual-nested PLL, e.g., PLL 510-2, inside a given unit cell independently generates the required phase for the neighboring VCO inside the adjacent unit cell/PLL, e.g., PLL 510-3. Note that this phase-shift generation technique in the proposed phased array 500 is in clear contrast to conventional phase-shifter-based phased arrays, which use a local phase shifter within a unit cell to generate the desired phase shift for the signal generated by the local VCO within the same unit cell.

Note that the proposed phased array 500 is configured to steer/scan the radiation beam independently in the X- and Y-directions. As can be seen in FIG. 5, the 2-dimensional array of unit cells in phased array 500 is actually formed from a chain of unit cells configured in the proposed PLL-coupled architecture 400. To form the rows and columns in phased array 500, the chain of unit cells is arranged in multiple rows and columns (e.g., 4 rows and 4 columns in array 500), wherein two adjacent rows in array 500 are coupled through a unit cell (i.e., unit cells 520, 522, and 524), which connects the two adjacent rows. Unit cells 520, 522, and 524 are also referred to as Y-control unit cells because they are the only unit cells which receive Y-control signal $V_{steer,y}$. For clarity, indicator arrows are used in FIG. 5 pointing to 4 rows, namely, R1, R2, R3, and R4 in array 500. It can be observed that all VCOs and antennas of the unit cells in a given row (R1-R4) in phased array 500 are arranged to have substantially the same Y-location/coordinate; wherein all VCOs and antennas of the unit cells in a given column in phased array 500 (e.g., in unit cells 520 and 524) are arranged to have substantially the same X-location/coordinate.

More specifically, each unit cell/PLL in phased array 500 receives an X-control signal $V_{steer,x}$ through the corresponding PWM module, except for row-connecting unit cells, i.e., Y-control unit cells 520, 522, and 524. For example, all unit cells in the bottom row R1 in phased array 500 receive the X-control signal $V_{steer,x}$. In some embodiments, by controlling X-control signal $V_{steer,x}$, an equal amount of phase shift between adjacent VCOs/unit cells within each row in the X-direction is produced. In other words, a phase shift between each pair of unit cells in a given row in phased array 500 can be modified by adjusting $V_{steer,x}$, resulting in the beam/radiation steering/scanning in the X direction.

Note that each Y-control unit cell 520, 522, and 524 receives Y-control signal $V_{steer,y}$ through the corresponding PWM module. $V_{steer,y}$ is configured to create a constant phase shift between rows in phased array 500. In some embodiments, only one Y-control unit cell/PLL is needed to change the phase shift from one row (e.g., R1) to the adjacent row (e.g., R2) in the Y-direction. In other words, if two corresponding unit cells in two adjacent rows (e.g., the unit cell corresponding to PLL 510-4 in row R1 and corresponding unit cell 520 in row R2) have a given phase shift in the Y-direction with respect to each other, then the other corresponding pair of cells having the same X-coordinates in these two adjacent rows (e.g., the unit cell corresponding to PLL 510-3 in row R1 and corresponding unit cell 530 in row R2) will automatically have the same phase shift in the Y-direction as well. Hence, by controlling $V_{steer,y}$ on each Y-control unit cell, the Y-direction phase shift between two adjacent rows in phased array 500 can be modified, resulting in the beam/radiation steering/scanning in Y-direction. Consequently, wideband beam steering in two dimensions can be achieved in the proposed phased array 500 by programming $V_{steer,x}$ and $V_{steer,y}$ control signals. Although not explicitly shown in FIG. 5, each unit cell in phased array 500 additionally receives low-frequency control signal at frequency $f_{DL}$ (e.g., 88 MHz in some exemplary designs). We will discuss this low-frequency control signal in more detail below in conjunction with FIGS. 6 and 7.

Note that while the exemplary phased array 500 has a 4×4 dimension, the topology of the proposed phased array 500 can be readily extended in both X and Y-dimensions, either independently or equally, to any desired size. Moreover, the numbers of unit cells in rows and columns in a proposed phased array can be different from each other. In other words, some embodiments of proposed phased array can have dimensions of M×N, wherein M≠N. However, in practice, the array size may be limited by the physical implementation challenges on the chip. For example, the supply voltage is typically provided to the circuit through bond wires, and different unit cells within a given phased array can have different wiring paths to the supply pads. Hence, and because of the sheet resistance, different unit cells may experience different supply voltages. This discrepancy in supply voltages can result in different self-resonance frequencies among different VCOs. In an extreme case, the above discrepancy and other possible mismatches can affect the locking strength of the phased array. One solution to the above problem is to design a highly symmetric layout for the phased-array circuit. Moreover, unwanted couplings between unit cells in an array, such as coupling through antennas and substrate, need to be minimized. In some embodiments, these unwanted couplings can be significantly reduced by using shielding antennas and other isolation techniques.

Figure 6:
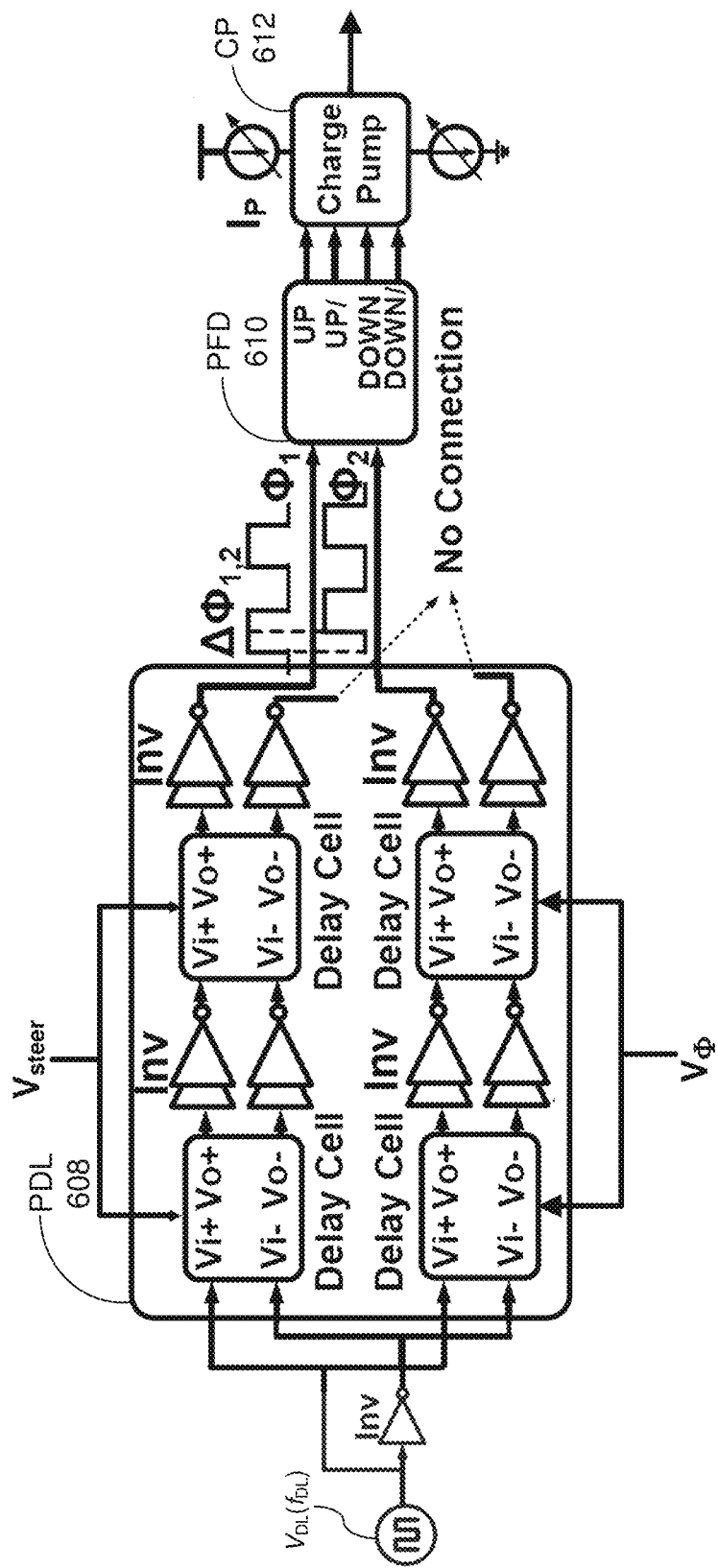
FIG. 6 shows the schematic of a pulse width modulation (PWM) circuit as an exemplary implementation of the proposed PWM module in the proposed dual-nested PLL for controlling the phase shift within the proposed phased array in accordance with some embodiments.

FIG. 6 shows the schematic of a PWM circuit 600 as an exemplary implementation of the proposed PWM module in the proposed dual-nested PLL 300 for controlling the phase shift within the proposed phased array 500 in accordance with some embodiments. Note that because PWM circuit 600 operates inside the proposed dual-nested PLL 300, PWM circuit 600 should be understood in the scope of the proposed dual-nested PLL 300. Specifically, PWM circuit 600 includes a detailed implementation 608 of PDL (Phase Delay Module) 308 within PWM 306 in the proposed dual-nested PLL 300. As can be seen in FIG. 6, PDL 608 is composed of two parallel and identical delay paths, wherein each delay path of the two delay paths further includes two serial stages of delay cells. In some embodiments, the delay cells in each stage of the two-stage delay cells are implemented with voltage-controlled delay lines. Note that while the embodiment of PDL 608 includes two stages of delay cells, other embodiments of the PWM module in the proposed dual-nested PLL can be configured with a phase delay module (PDL) having fewer stages (e.g., a single stage) or more stages (e.g., three or four stages) of serially-coupled delay cells without departing from the present scope. In some embodiments, the number of stages of delay cells in a given PDL may be determined based on a range of phase shift required by a particular application.

During a phased-array operation, PWM circuit 600 receives a reference clock signal referred to as $V_{DL}$. In some embodiments, $V_{DL}$ is a low frequency clock having a frequency $f_{DL}$. As shown in FIG. 6, $V_{DL}$ is fed to the first stage of the delay cells in PDL 608 and is used to control the speed of slow loop 322. As described above in conjunction with FIG. 3, $f_{DL}$ is chosen carefully so that slow loop 322 in the proposed dual-nested PLL 300 operates at optimal speed to lock the phase. If $f_{DL}$ is set too high, then slow loop 322 operates very fast and the loop becomes unstable and cannot lock the phase. On the other hand, if $f_{DL}$ is set too low, then slow loop 322 operates very slowly and it will take a long time for slow loop 322 to settle and lock the phase.

As previously described in conjunction with FIG. 3, PWM circuit 600 receives a DC phase error signal $V_\Phi$ from LPF2 in the slow loop, which is used as the first control input to the lower delay path of the two-stage PDL 608. As described in conjunction with FIG. 5, depending on the type of unit cells the PWM circuit 600 is used for, PWM circuit 600 also receives one of the two steering control signals $V_{steer,x}$ and $V_{steer,y}$, which is collectively referred to as $V_{steer}$ in PWM circuit 600. As shown in FIG. 6, complementary to error signal $V_\Phi$, control signal $V_{steer}$ is used as the second control input to the upper delay path of the two-stage PDL 608. Hence, $V_\Phi$ controls the delay of the lower delay cells in PDL 608, whereas $V_{steer}$ controls the delay of the upper delay cells in PDL 608.

Note that if $V_\Phi$ and $V_{steer}$ are different from each other, then the upper and lower delay paths in PDL 608 output two delayed $V_{DL}$ signals with different delays, as illustrated by the two exemplary signal waveforms having a phase difference of $\Delta V_{\Phi 1,2}$ between PDL 608 and PFD 610. In other words, the input signal $V_{DL}$ would reach PFD 610 with different delays. Phase difference $\Delta V_{\Phi 1,2}$ is then detected by PFD 610. As a result, charge pump CP 612 starts injecting or pulling current to or from LPF1 in the proposed dual-nested PLL 300. Consequently, the control voltage $V_C$ of VCO 302 changes to adjust the phase difference between VCO 302 output $V_{PLL}$ and reference VCO input $V_{ref}$. In some embodiments, PFD 610 and CP 612 can be implemented with any phase-frequency detector and charge pump now known or later developed.

Note that when the slow loop 322 eventually locks, a stable condition is reached and $V_\Phi$ is forced to be equal to $V_{steer}$ to introduce the same delay to the two delay paths of signals fed to PFD 610. As a result, control signal $V_C$ becomes a fixed voltage and the output of VCO 302 is phase-locked to the reference VCO input. However, before the phase is locked, the PDL/PFD/CP block generates pulses whose duration is proportional to the phase difference $\Delta V_{\Phi 1,2}$ between the two delay paths of the reference input $V_{DL}$. In other words, the PDL/PFD/CP block inside PWM circuit 600 performs pulse width modulation (PWM), as the name for the PWM module 306 indicates.

Based on the above analysis, it becomes readily understood that a predetermined phase shift between PLL 300 output $V_{PLL}$ and PLL 300 reference input $V_{ref}$ in FIG. 3 can be achieved by simply changing the value of control input $V_{steer}$. The loop dynamic of PLL 300 eventually forces $V_\Phi$ to be equal to $V_{steer}$. Hence, a different value of $V_{steer}$ means a different phase shift is generated between $V_{PLL}$ and $V_{ref}$. Note that the phase shifting/locking operation of the disclosed dual-nested PLL is inherently wideband as long as the associated loop gain is constant. Consequently, the bandwidth of the phase shifting operation of the disclosed dual-nested PLL can be increased by keeping the loop gain constant over a wider range of frequencies. It should be noted that without the disclosed PDL 308/608, the proposed PWM 306 becomes a conventional phase detector where a conventional PFD is used for phase and frequency detection. However, without PDL 308, the proposed phase tracking and locking separated from the frequency locking would not be possible at the intended mm-wave/sub-THz operation range.

Figure 7:
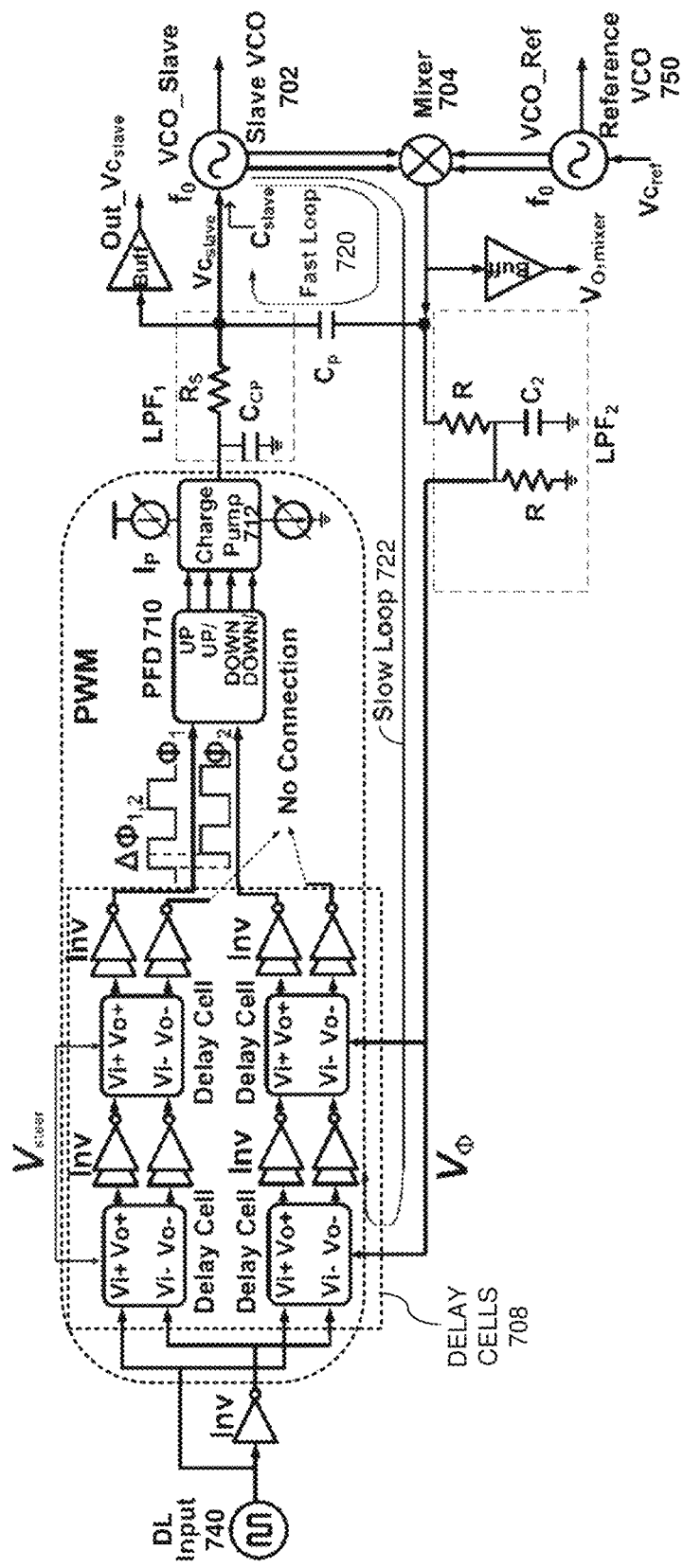
FIG. 7 shows a detailed circuit diagram of the disclosed dual-nested PLL using the proposed PWM circuit for phased array applications in accordance with some embodiments.

FIG. 7 shows a detailed circuit diagram 700 of the disclosed dual-nested PLL 300 using PWM circuit 600 for phased array applications in accordance with some embodiments. As can be seen in FIG. 7, dual-nested PLL 700 includes two distinct/nested loops, namely, a fast loop 720 and a slow loop 722. The two loops work together to lock the slave VCO 702 of dual-nested PLL 700 to the reference VCO 750. Note that reference VCO 750 is not part of dual-nested PLL 700, but can be a local VCO of an adjacent dual-nested PLL in a PLL-coupled array, wherein the PLL-coupled array can be a phased array. As has been described above, mixer 704 is used a phase/frequency detector and captures the phase difference between slave VCO 702 and reference VCO 750. Note that FIG. 7 shows two arrows between each of the two VCOs and mixer 704, indicating both of the VCO signals feeding into mixer 704 are differential signals As has been described above, fast loop 720 which includes slave VCO 702 and mixer 704, works as a type-I PLL. Mixer 704 can further include a built-in low pass filter eliminate certain high-frequency components of the mixer output signal. The high-frequency component of the mixer's output signal which results from the phase difference between the two VCOs is fed to the control voltage $V_{Cslave}$ of slave VCO 702 through capacitor $C_p$. Fast loop 720 as a type-I PLL can lock the frequency of slave VCO 702 to reference VCO 750, but cannot lock the phase of the slave VCO to the phase of the reference VCO. As a result, a residual phase error remains between two VCOs which is corrected by slow loop 722.

As has been further described above, slow loop 722 contains mixer 704, delay cells 708, PFD 710, charge pump 712 and LPF1. The output of mixer 704 passes through the second LPF2, which obtains the DC component of the mixer's output $V_\Phi$. $V_\Phi$ controls the delay of the lower delay cells 708 while $V_{steer}$ controls the delay of the upper delay cells 708. If $V_\Phi$ and $V_{steer}$ are different, then the DL input signal 740 reaches PFD 710 with different delays following the upper path and the lower path of delay cells 708, which results in a $\Delta V_{\Phi1,2}$ phase difference between the two paths. This phase difference is then detected by the PFD 710, which causes charge pump 712 to start injecting or pulling current to or from LPF1. As a result, the control voltage $V_{Cslave}$ of slave VCO 702 changes. In the stable condition, $V_{Cslave}$ is a fixed voltage and $V_\Phi$ and $V_{steer}$ are equal to each other. Slow loop 722 operates as a type-II PLL that can lock both the frequency and the phase of slave VCO 702 to $V_{Cref}$. Slow loop 722 is an unstable PLL by itself, but becomes a stable loop when works together with fast loop 720. Hence, fast loop 720 operates to quickly bring the frequencies of the two VCO together, while slow loop 722 corrects the residual phase difference between the two VCOs.

Figure 8:
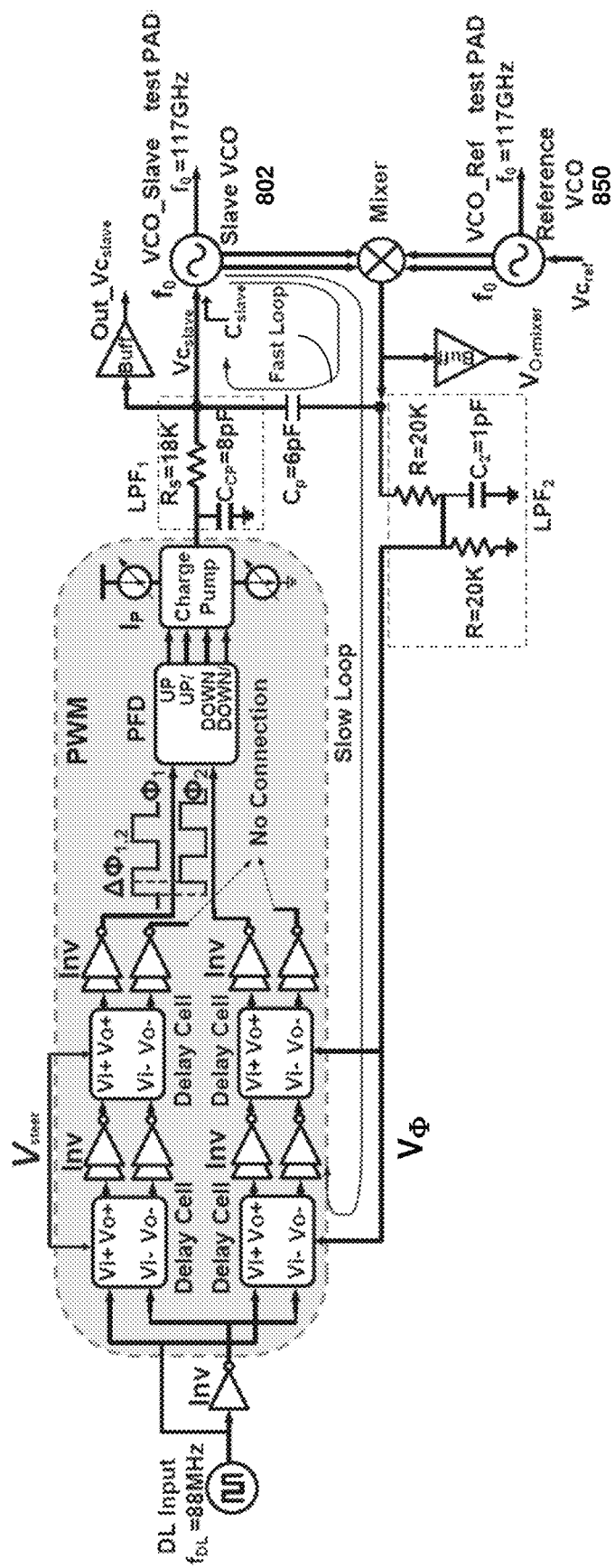
FIG. 8 shows a detailed circuit diagram of the disclosed dual-nested PLL implemented in a two-element PLL-coupled system for mm-wave phased-array application in accordance with some embodiments.

FIG. 8 shows a detailed circuit diagram 800 of the disclosed dual-nested PLL 300 implemented in a two-element PLL-coupled system for mm-wave phased-array application in accordance with some embodiments. As can be seen in FIG. 8, the implemented two-element PLL-coupled system 800 contains a slave VCO 802 and an identical reference VCO 850, which provides frequency and phase references for the slave VCO 802. In some embodiments, reference VCO 850 has a center frequency of 117.23 GHz and a tuning range of 9.01 GHz. Slave VCO 802 is connected to the previously disclosed control loops and is phase and frequency locked to reference VCO 850. Moreover, a DC control voltage, $V_{steer}$, is used to change the phase shift between the two VCOs. We will describe the loop behavior and operation principle of the two-element PLL-coupled system 800 in more detail below.

The component values of $LPF_1$ can be chosen to suppress the ripples and at the same time keep the loop stable. The output voltage of the mixer is at a higher level than what the control voltage of the delay cell can handle. The ratio of R is chosen to have a correct voltage divider at the output of the mixer and create a suitable voltage level for the delay cell. Note that when $C_p$ value is increased, the stability of the loop can be improved, but at the same time more chip area is consumed. In an exemplary design, $C_p=6$ pF is chosen as a compromise between area and stability.

Note that one of the advantages of the PLL-coupled architecture 800 is the removal of an injection-locked frequency divider (ILFD) at 117 GHz, which is conventionally used in an integer-N PLL. This exclusion leads to a higher locking range and lower power consumption. Moreover, the high frequency routings are limited to the ones between the two VCOs and the adjacent mixers and therefore can be significantly shortened. With no actual phase shifters used in this architecture and to achieve the phase shift by adjusting a control voltage, the disclosed PLL-coupled system 800 can accurately control the phase shift between VCOs 802 and 850, and enable beam steering (when used in a phased array) using the fast and the slow loops that work together. The disclosed PLL-coupled architecture becomes particularly useful for phased array systems at sub-THz frequencies when conventional phase shifters exhibit significant loss at this frequency range.

Figure 9:
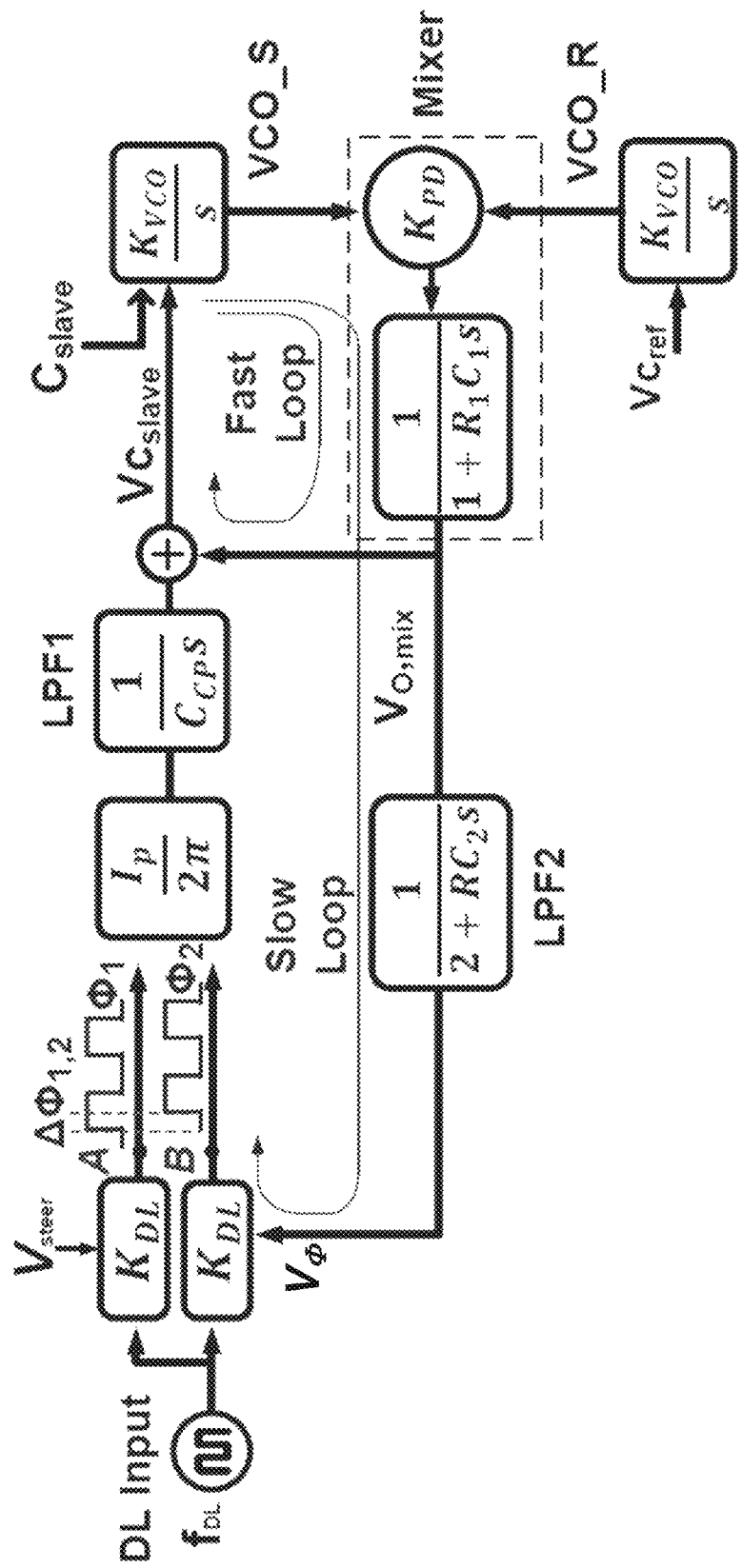
FIG. 9 shows a linear model of the proposed dual-nested PLL and PLL-coupled array for analyzing the operation and stability of the control loop in accordance with some embodiments.

FIG. 9 shows a linear model of the proposed dual-nested PLL and PLL-coupled array for analyzing the operation and stability of the control loop in accordance with some embodiments. Note that LPF1 can be simplified to just a capacitor $C_{cp}$ in this linear model, because $C_{cp}$ reactance at 88 MHz is much smaller than the magnitude of the $R_s=18$ K$\Omega$. $C_p$ is used to directly connect the mixer to $V_{c_{slave}}$ in AC mode. In the fast loop, as the loop is locking, the phase change is rapid and therefore the output of the mixer is fast moving compared to the output of the charge pump in the slow loop. Therefore, the output of the mixer and output of the charge pump can be regarded as AC and DC signals, respectively. As a result, $C_p$ in FIGS. 3, 7, and 8 can be modeled as an adder of these two signals, as shown in FIG. 9. The open-loop transfer function, $G_F(s)$, and closed-loop transfer function, $H_F(s)$ of the fast loop can be derived as:

$$G_F(s) = K_{PD} \cdot \frac{K_{VCO}}{s} \cdot \frac{1}{R_1 C_1 s + 1} \tag{1}$$

and $$H_F(s) = \frac{\phi_{slave}}{\phi_{ref}}(s) = \frac{K_{VCO} K_{PD}}{R_1 C_1 s^2 + s + K_{VCO} K_{PD}}, \tag{2}$$

wherein $R_1$ and $C_1$ create a low-pass filter that is implemented at the output of the mixer (see FIG. 13 below) and $K_{VCO}$ and $K_{PD}$ are the gain of the VCOs and mixer respectively.

As a type-I PLL, the fast loop in the disclosed dual-nested PLL has a DC gain that results in the residual phase error between the reference and slave VCOs. A simulation was performed for the case when the fast loop operates alone and the slow loop was removed from FIG. 9 to prove that the fast loop can lock the frequency. It should be noted that $C_p$ acts as a voltage divider together with the capacitance seen from the slave VCO, $C_{slave}$. However, the dynamic of the fast loop remains unchanged, because the value of $C_p$ is much larger than $C_{slave}$.

To ensure zero phase error between the VCOs in FIG. 9, the combination of the fast and slow loops has to operate together as a type-II PLL. As shown in FIG. 9, the slow loop contains the delay cell, the PFD, the charge pump, the slave VCO, the mixer, and the low-pass filters. The open-loop transfer function, $G_S(s)$, and closed-loop transfer function, $H_S(s)$ of the slow loop can be derived as:

$$G_S(s) = K_{PD} \frac{I_P K_{DL} f_{DL}}{C_{CP} s} \cdot \frac{K_{VCO}}{s} \cdot \frac{1}{1 + R_1 C_1 s} \cdot \frac{1}{2 + RC_2 s} \tag{3}$$

and $$H_S(s) = \frac{\phi_{slave}}{\phi_{ref}}(s) = \frac{G_S(s)}{1 + G_S(s)}, \tag{4}$$

where $f_{DL}$ is the frequency of the reference input signal applied to the delay cells and $K_{DL}$ is the gain of voltage-controlled delay cells. The open-loop transfer function of the slow loop, $G_S(s)$, exhibits a type-II PLL containing two poles at origin (i.e., two ideal integrators). This represents an oscillatory system and instability is expected. However, when the two loops (the fast loop and the slow loop) work concurrently, one zero is created, making the system stable. The open-loop transfer function of the complete PLL with both loops activated can be expressed as:

$$G_C(s) = G_F(s) + G_S(s) = \frac{K_{PD}K_{VCO}}{s(1+R_1C_1s)}\left[1 + \frac{I_P K_{DL} f_{DL}}{C_{CP}s(2+RC_2s)}\right]. \quad (5)$$

Note that Eq. (5) clearly indicates the presence of one zero within the closed-loop transfer function, and the loop is thus stabilized. In summary, control loop comprising of fast and slow loops represents a stable type-II PLL, which locks both the phase and frequency of the two VCOs. Moreover, with this unique PLL architecture, a designer now has the ability to accurately change the phase shift between the VCOs by changing a simple bias voltage $V_{steer}$.

Figure 10:
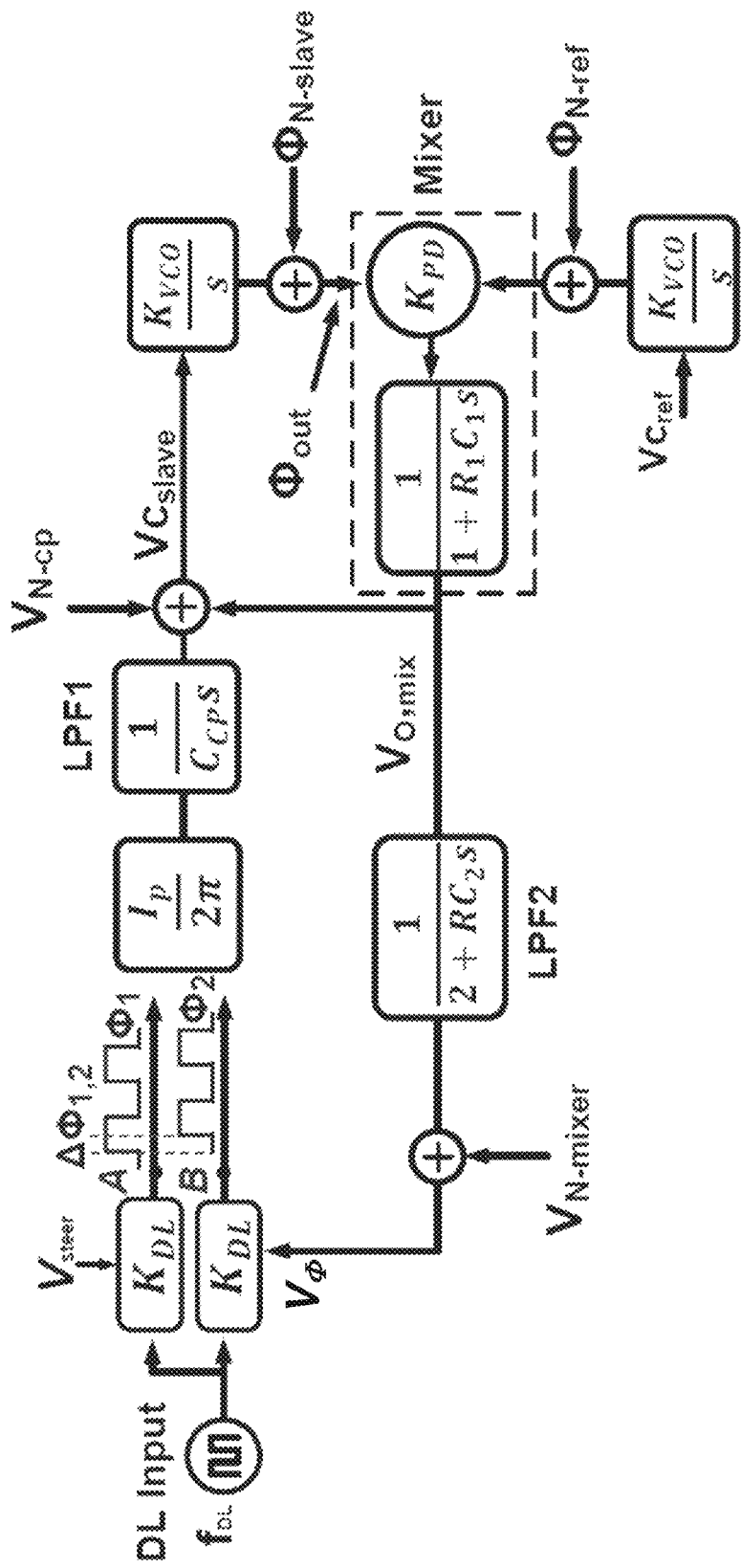
FIG. 10 shows the noise sources used to perform the noise analysis of the disclosed dual-nested PLL in accordance with some embodiments.

FIG. 10 shows the noise sources used to perform the noise analysis of the disclosed dual-nested PLL in accordance with some embodiments. The noise of the slave VCO, reference VCO, mixer and charge pump are modeled as noise sources $\Phi_{N\text{-}slave}$, $\Phi_{N\text{-}ref}$, $\Phi_{N\text{-}mixer}$ and $\Phi_{N\text{-}cp}$, respectively. The power spectral density of the output noise (at the output of the slave VCO) with respect to each one of the mentioned sources is calculated as a function of frequency. The simulation results showed that the magnitude of the transfer function of the output noise with respect to the noise of the reference VCO has a low pass behavior, which is to be expected from a type-II PLL. In contrast, the noise of the slave VCO has a high pass behavior to the output. Moreover, the power spectral density of the output phase with respect to the noise of the mixer has a low pass behavior, and with respect to the noise of the charge pump follows a band-pass response. The noise of the DL input (88 MHz reference) does not contribute much to the total noise at the output, because the jitter added from the DL input to the output of both delay cells is correlated. Simulation further shows that phase noise contribution of the reference VCO to the total in-band phase noise is much higher than the other components of the PLL. On the other hand, the out of band phase noise is dominated by the phase noise of the slave VCO. This means that if the reference VCO is locked to a low phase noise crystal, the in-band phase noise will be reduced significantly. As a result of suppressing phase noise from the reference VCO, the mixers' phase noise would have more effect on the in-band phase noise and would be accumulated in later stages.

Figure 11:
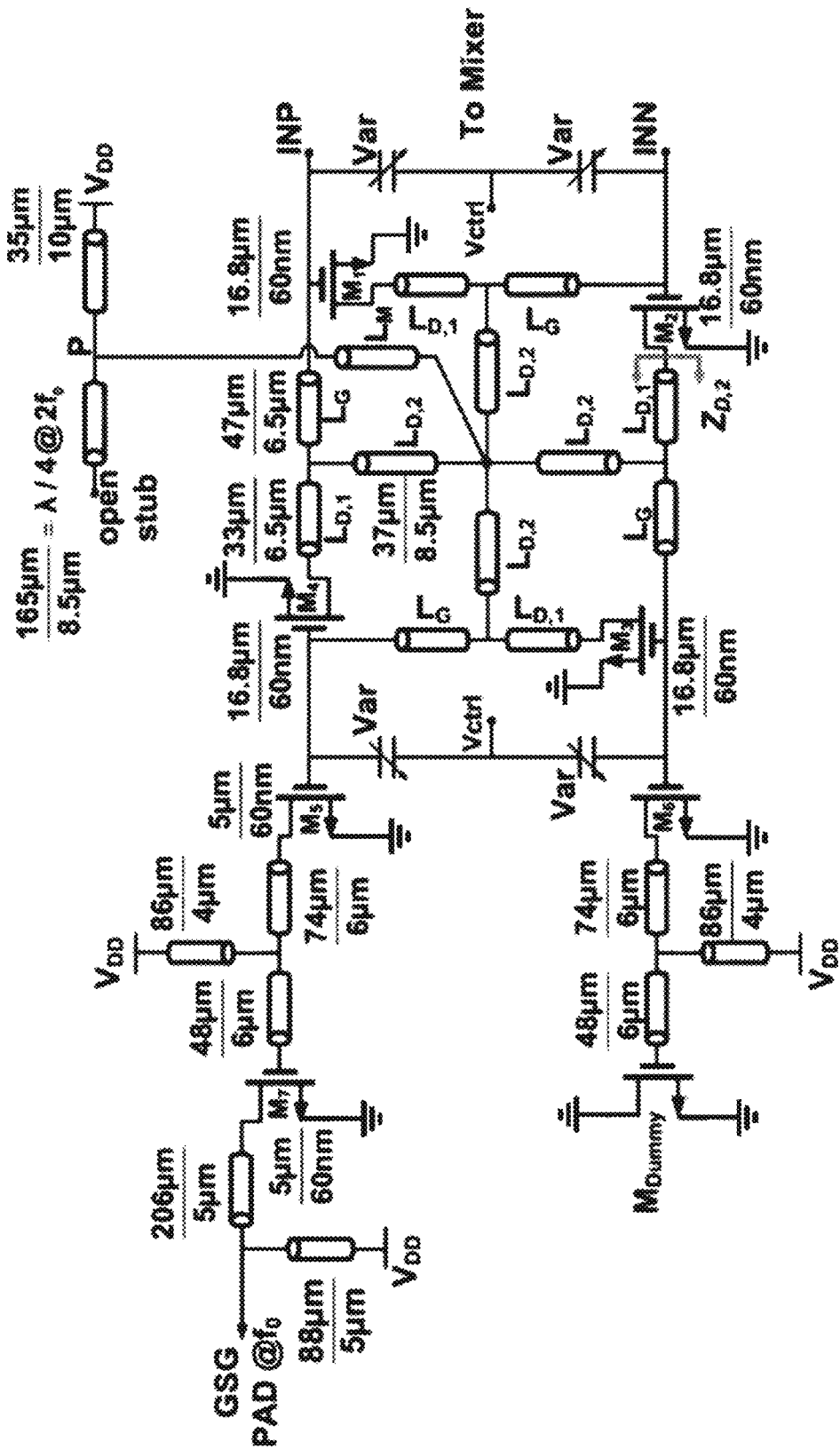
FIG. 11 shows the circuit topology of an exemplary voltage-controlled oscillator (VCO) which is used in the disclosed PLL-coupled array system at 117 GHz in accordance with some embodiments.

FIG. 11 shows the circuit topology of an exemplary VCO which is used in the disclosed PLL-coupled array system at 117 GHz in accordance with some embodiments. As can be seen in FIG. 11, the oscillator core of the VCO is composed of 4 stages. As a result, the dominant mode of oscillation has 180° phase shift per stage. This structure enables differential access to the VCO from left and right sides without creating any imbalance in the system. This is an important feature imposed by the proposed phased array of FIG. 5, as each mixer requires a differential signal from each associated VCO.

Note that each stage of the oscillator further includes three transmission lines, i.e., $L_{D,1}$, $L_{D,2}$ and $L_G$. $L_{D,2}$ lines merge in the middle, which is a virtual ground. The transistors and the transmission lines are laid out similar to the circuit diagram in FIG. 11. This arrangement of the transmission lines boosts the 2nd harmonic current generated by the transistors. Therefore, a significant 2nd harmonic voltage at the drain is generated. Previous study has shown that this 2nd harmonic voltage can boost the swing at the fundamental $f_0$. This present analysis further shows that that there is positive feedback that increases the amplitude of both fundamental and 2nd harmonic signals at the drain. If the drain loads at $f_0$ and $2f_0$ are resistive, the voltage swing at both fundamental and 2nd harmonic is enhanced. The transmission line configuration at the drain of the transistors in the VCO design of FIG. 11 ensures a resonance near the 2nd harmonic frequency. With a high 2nd harmonic drain current, the 2nd harmonic voltage at the drain will be significant if the impedance at drain nodes of $M_1$-$M_4$ are high at $2f_0$.

In some embodiments, all transmission lines of the VCO design of FIG. 11 can be implemented using the topmost aluminum layer for high characteristic impedance. This helps achieve higher drain impedance at $2f_0$. As stated above, the common node where all $L_{D,2}$ lines meet in the middle is virtual ground for odd harmonics only. Therefore, $L_M$ and the following circuits have no impact on the oscillation frequency. Nevertheless, they have an impact on the drain impedance at $2f_0$. In order to maintain high drain impedance at $2f_0$, an open-stub at $2f_0$ can be deployed. This stub creates a short to ground at node P. The Length of $L_M$ is adjusted such that a high drain impedance can be achieved at $2f_0$ for $M_1$-$M_4$.

The shorted line is also used to provide the supply voltage $V_{DD}$ and can be used to extract the 4th harmonic power if needed in a sub-THz phased array. Similarly, by a simple redesign of the common virtual ground node, the 2nd harmonic can be extracted if needed. Therefore, if the operation frequency of an application is higher than the $f_{max}$ of the transistors, this VCO can yield a boosted 2nd or 4th harmonic signal to cover the desired frequency range with more phase shift range. On the other hand, if the operation frequency of an application is lower than the $f_{max}$ of the transistors, the 2nd or 4th harmonic signal can be used to increase the phase shift range at the cost of a larger area and lower output power.

Figure 12A:
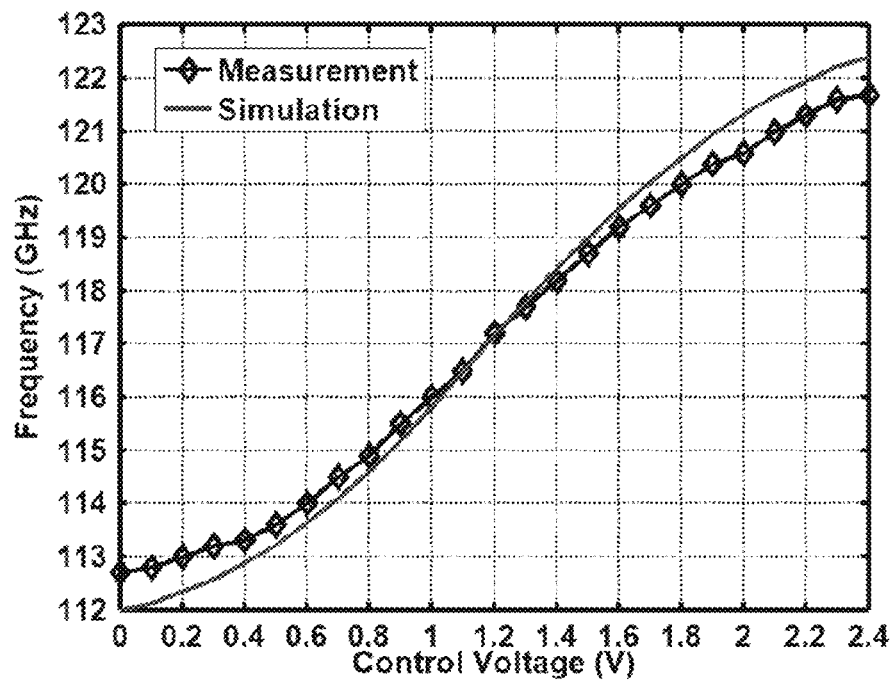
FIG. 12A shows the measured and simulated tuning range of the stand-alone VCO of FIG. 10 at the fundamental frequency in accordance with some embodiments.
Figure 12B:
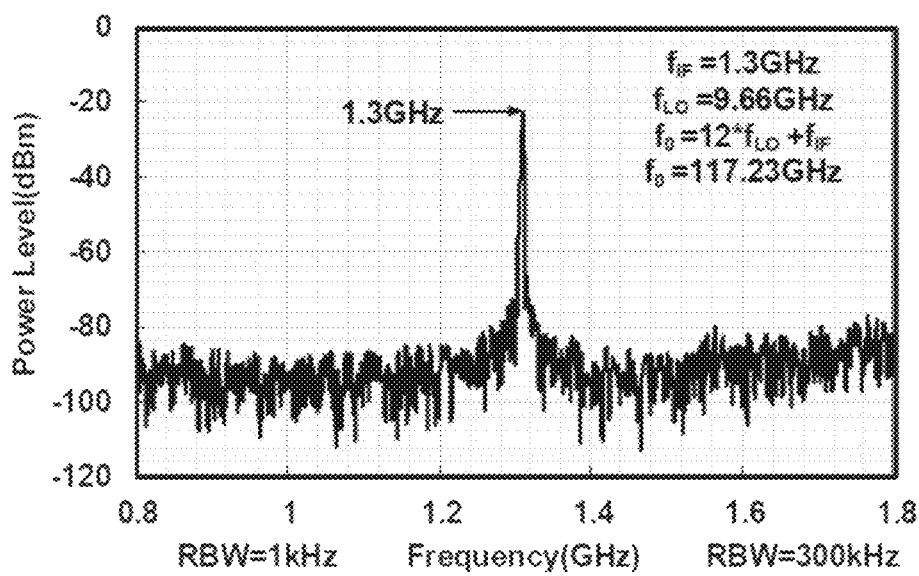
FIG. 12B shows the measured down-converted output spectrum of the reference VCO in accordance with some embodiments.

High harmonic amplitudes at $f_0$ and $2f_0$ create a pseudo half-sine waveform at the drain of each transistor, which is proved to improve phase noise. On the other hand, $L_{D,1}$ works as a series peaking inductor and increases the swing at the drain. High swing at the drain pushes the transistor into deep triode region for high 2nd harmonic current generation. Studies have shown that operation in deep triode region is not necessarily harmful to phase noise, and can even improve it by depleting device noise from drain to ground as long as the drain-source oscillation waveform remains half-sine. FIG. 12A shows the measured and simulated tuning range of the stand-alone VCO of FIG. 10 at the fundamental frequency in accordance with some embodiments. This plot demonstrates the tuning range of 9.01 GHz at fundamental frequency ranging from 112.66 to 121.67 GHz. FIG. 12B shows the measured down-converted output spectrum of the reference VCO in accordance with some embodiments.

Figure 13:
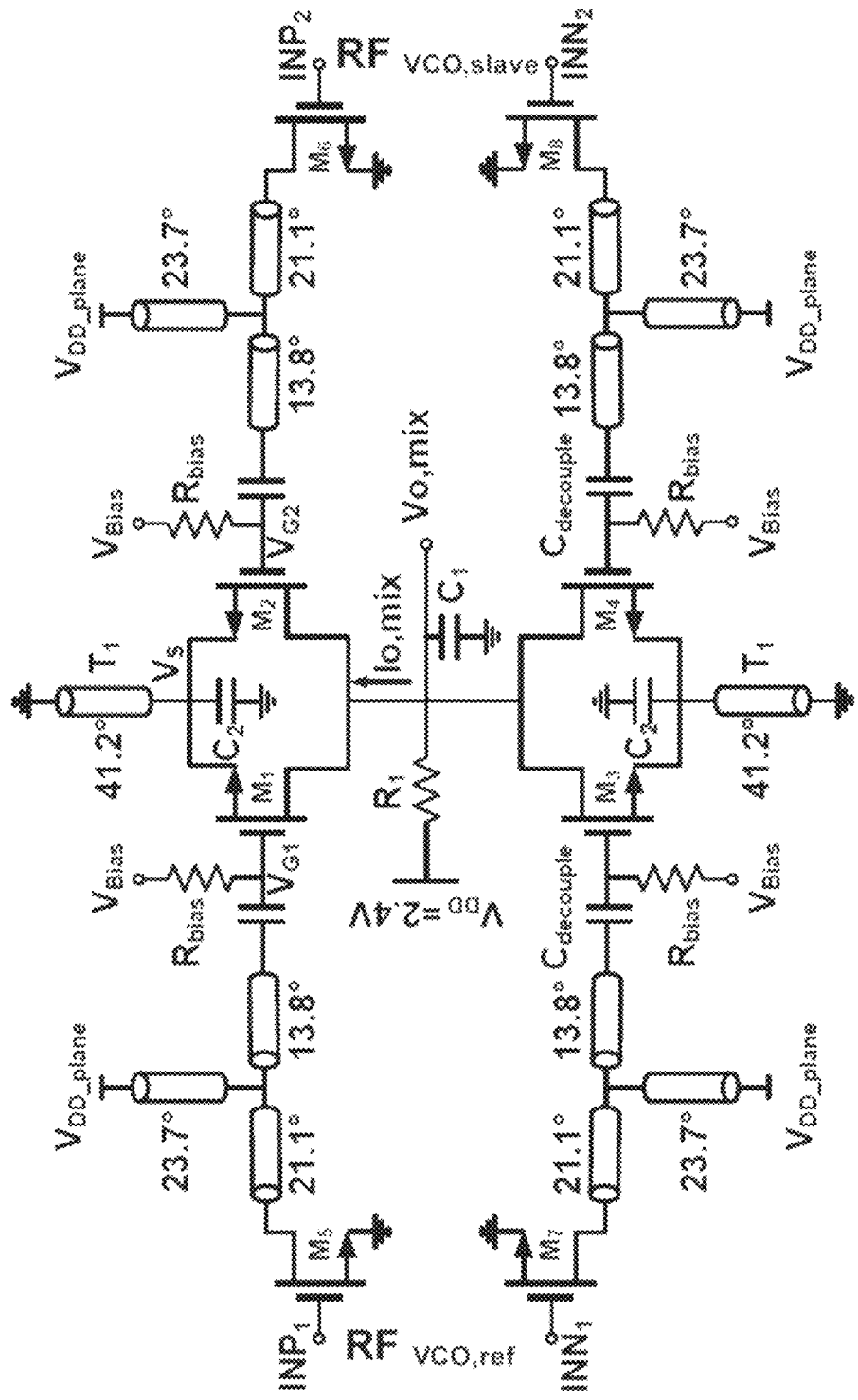
FIG. 13 shows schematic of an exemplary implementation of the differential mixer used in the disclosed dual-nested PLL as a phase/frequency detector in accordance with some embodiments.

FIG. 13 shows schematic of an exemplary implementation of the differential mixer used in the disclosed dual-nested PLL as a phase/frequency detector in accordance with some embodiments. Note that this topology of mixer design enables the differential signals to be routed symmetrically from the left and right sides of the mixer in the layout. As a result, there is no need for long and lossy interconnects from VCOs to the mixer, which makes the disclosed PLL architecture scalable. In the design of FIG. 13, transistors $M_5$-$M_8$ act as buffers between VCOs and mixer core ($M_1$-$M_4$). The T-network matching between the buffer and the core mixer is designed to maximize the oscillation amplitude applied to the mixer core. The transmission line $T_1$ and $C_2$ are designed to resonate and increase the impedance seen at $f_0$ (e.g., at 117 GHz) from the source nodes, utilizing the square law characteristic for mixing performance. The supply of the buffers is connected to the 1-V $V_{DD}$ plane, whereas mixer transistors operate with 2.4 V supply voltage.

Assuming the output voltage of the reference VCO and slave VCO can be expressed as:

$$V_{ref}(t) = A\sin(\omega_{ref}t + \phi_{ref}),$$

$$V_{slave}(t) = A\sin(\omega_{slave}t + \phi_{slave}), \quad (6)$$

the buffers will amplify and apply these signals to the mixer. Because the source nodes in the mixer are designed to be high impedance at the fundamental frequency, the output of the mixer is the multiplication of the input signals. $R_1$ and $C_1$ at the output of the mixer create a low-pass filter. When the frequency of VCOs is locked, the output signal of the mixer can be expressed as:

$$V_{O,mix}(t) = K_{PD}(\phi_{slave}(t) - \phi_{ref}(t)). \quad (7)$$

Figure 14:
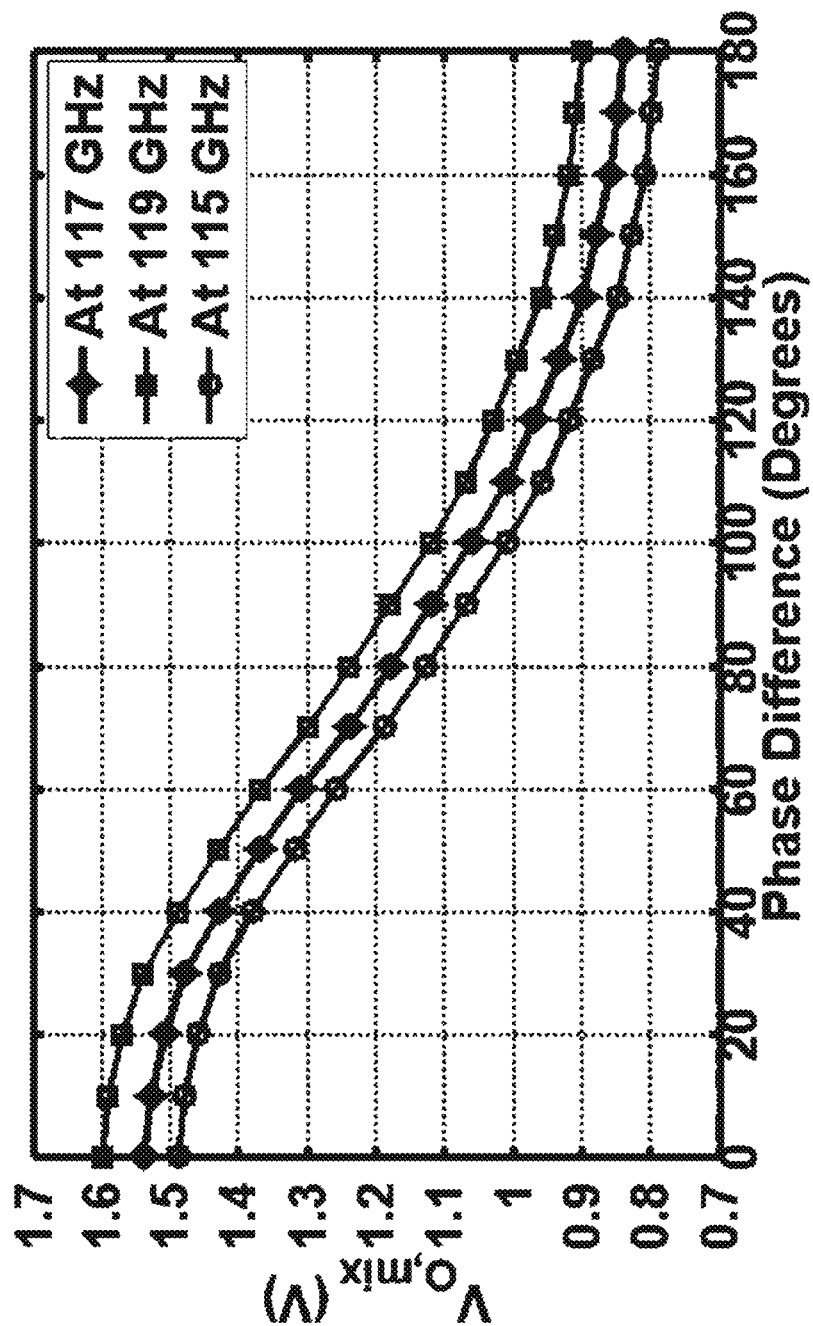
FIG. 14 shows the simulated output voltage of the mixer as a function of phase difference between the reference and slave VCOs with the slope of $K_{PD}$ in accordance with some embodiments.

FIG. 14 shows the simulated output voltage of the mixer as a function of phase difference between the reference and slave VCOs with the slope of $K_{PD}$ in accordance with some embodiments. As can be seen in FIG. 14, the $K_{PD}$ decreases for the phase difference larger than 120° and lower than 40°, leading to a lower loop gain. As a result, frequency locking and phase steering of the PLL is limited by the mixer characteristic. This means the minimum and maximum phase shift that can be achieved between the VCOs at $f_0$ (117 GHz) is 40° and 120°, respectively. In some embodiments, to further reach −200° to +120° phase shift in the proposed phased array in FIG. 5, the 4th harmonic from the VCOs can be extracted, which is then radiated using an on-chip antenna.

As demonstrated in FIGS. 6-8, the low frequency part of the disclosed PWM module 600, dual-nested PLL 700, and the two-element coupled PLL array 800 all contain voltage-controlled delay line, PFD, CP and LPF$_1$. Moreover, a square-shaped signal is applied to the disclosed two paths of the delay cells. The output of each delay cell is a delayed version of the reference signal $V_{DL}$ that can be controlled by $V_\Phi$ and $V_{steer}$. If $V_\Phi$ and $V_{steer}$ are equal, the relative delay between the two paths will be zero. Therefore, in steady state and under locked condition $V_\Phi$ will be equal to $V_{steer}$ and the output current of the charge pump will become zero.

Figure 15:
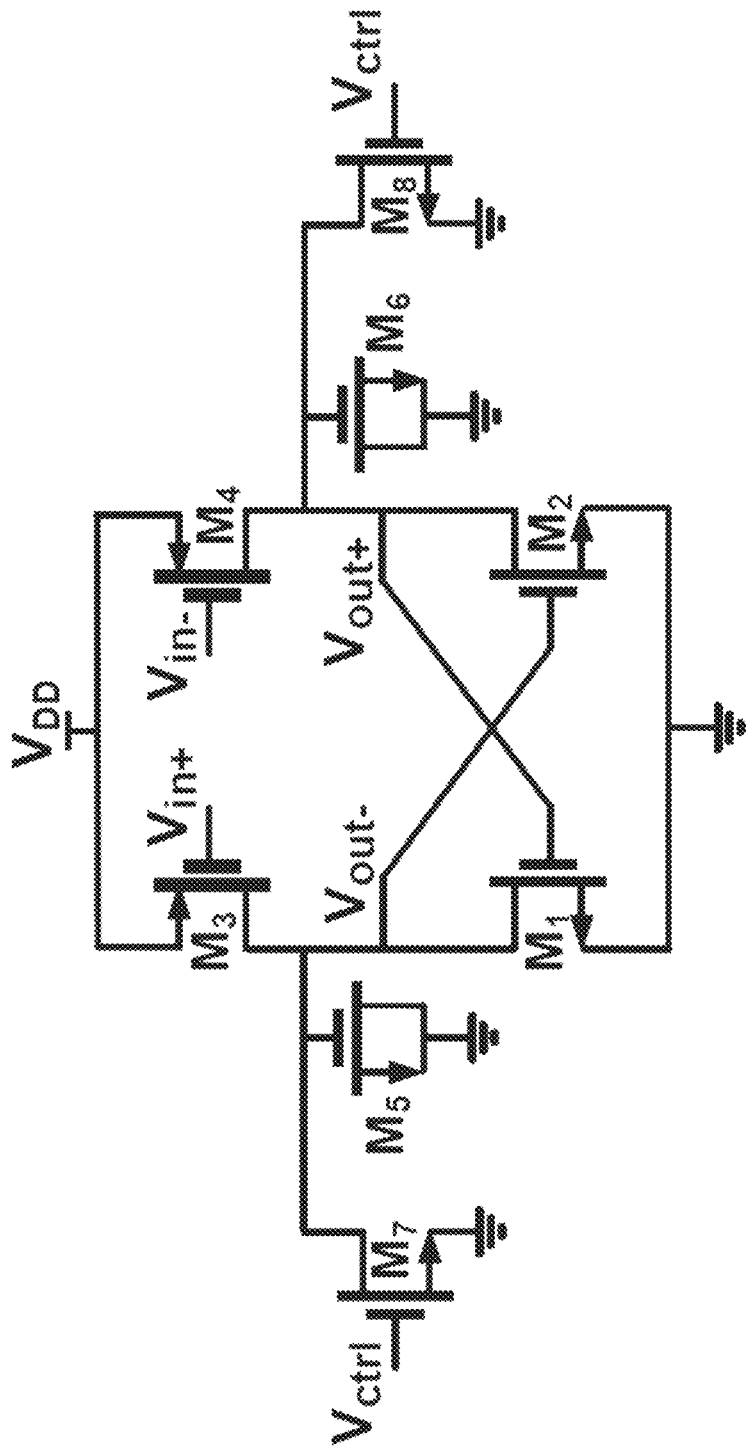
FIG. 15 shows the schematic of an exemplary implementation of the differential delay cell in accordance with some embodiments.

FIG. 15 shows the schematic of an exemplary implementation of the differential delay cell in accordance with some embodiments. Note that when $M_3$ and $M_4$ are turned on, their drain currents are equal to those of $M_7$ and $M_8$, respectively. The $M_1$ and $M_2$ combination ensures that $V_{out−}$ and $V_{out+}$ are at voltages close to GND or $V_{DD}$. The delay from input to output is a function of the drain current of $M_3$ and $M_4$, which are controlled by $V_{ctrl}$ and the total capacitance seen at output nodes. $M_5$ and $M_6$ are used to increase the total capacitance at the output nodes. An optimum $K_{DL}$ needs to be selected to provide sufficient loop gain and satisfy loop stability. As shown in Eq. (5), the total gain of the delay lines can also be manipulated by changing $f_{DL}$. The steering phase can be altered, by externally changing $V_{steer}$.

Figure 16:
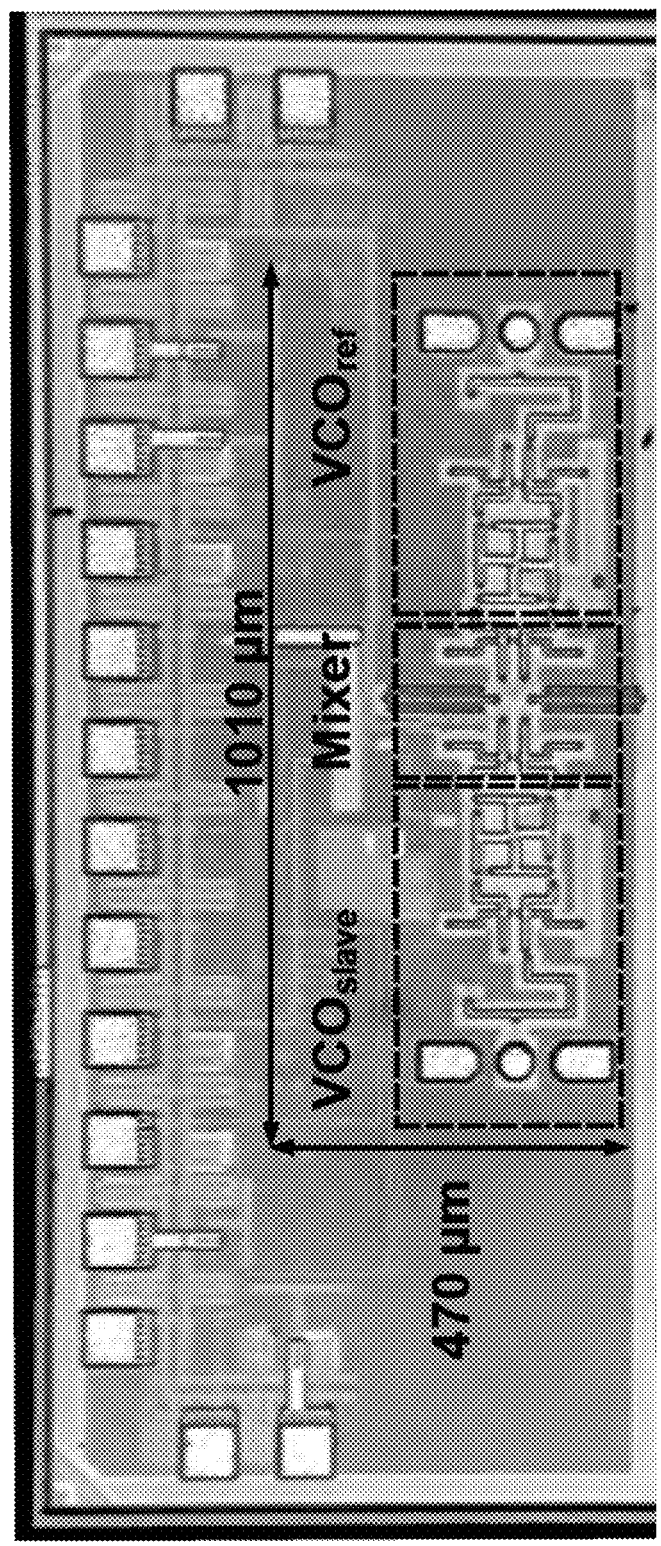
FIG. 16 shows a die micrograph of the 117-GHz PLL-coupled array system in accordance with some embodiments.

The circuit of the disclosed PLL-coupled array system was fabricated in a 65nm CMOS process. FIG. 16 shows a die micrograph of the 117-GHz PLL-coupled array system in accordance with some embodiments. The supply voltage for $V_{DD}$ plane was 1 V. The mixer core and charge pump operate with 2.4 V supply to provide wider control voltage. The delay cell and PFD also operate with 1 V supply. We were able to monitor Vc$_{slave}$ in a steady state operation. This voltage closely follows the Vc$_{ref}$, showing frequency locked operation over a wide frequency range of 113-121 GHz.

The proposed PLL-coupled array architecture removes the need for phase shifters at high or low frequencies for phased array applications. By eliminating the phase shifters from the phased array design, the loss and power consumption have been reduced significantly. In addition, in the disclosed PLL-coupled array architecture, the required phase shift can be generated by simply changing an analog control voltage. To overcome the design challenges of a wide-band linear PLL at high frequencies, higher harmonics of the VCO can be used as the output signal which can increase the phase range significantly. Similarly, frequency dividers can be used before the phase detector to reduce the required operation frequency and bandwidth for the phase detector and effectively increase linearity.

Novel phased array architectures based on novel PLL-based phase shifting techniques for the implementation in mm-wave/sub-THz range have been disclosed. The disclosed phased array architectures avoid using phase shifters, which are lossy at mm-wave frequencies. By utilizing a disclosed dual-nested loop PLL, a range of phase shift can be generated between a local VCO and a reference clock. The circuit implementation of the two-element PLL-coupled based on the disclosed dual-nested PLL employs symmetrical mixer topology and differential VCO signaling to avoid long signal routings at high-frequencies, thereby making the system scalable for mm-wave and sub-THz phased arrays with a large number of elements. In the disclosed PLL-coupled array, the fast loop and the slow loop work together to create a type-II PLL that can provide the required phase shift between the slave and reference oscillator. In some embodiments, a wide phase shift at 117 GHz was achieved with the two-element PLL-coupled array with a power consumption measured at 147 mW.

The disclosed phased array architecture can be used in imaging and radar applications, such as FMCW (Frequency Modulated Continuous Wave) automotive radars, to provide accurate range and doppler velocity information used for collision avoidance and automatic cruise control. Moreover, the PLL-coupled array can be used in communication systems to generate the phase shift in LO path of a phased array communication transceiver. The disclosed PLL-based phased array architecture is inherently scalable and therefore is an attractive choice for implementing radiating structures at THz and mm-wave frequencies.

An environment in which one or more embodiments described above are executed may incorporate a general-purpose computer or a special-purpose device such as a hand-held computer or communication device. Some details of such devices (e.g., processor, memory, data storage, display) may be omitted for the sake of clarity. A component such as a processor or memory to which one or more tasks or functions are attributed may be a general component temporarily configured to perform the specified task or function, or may be a specific component manufactured to perform the task or function. The term "processor" as used herein refers to one or more electronic circuits, devices, chips, processing cores and/or other components configured to process data and/or computer program code.

Data structures and program code described in this detailed description are typically stored on a non-transitory computer-readable storage medium, which may be any device or medium that can store code and/or data for use by a computer system. Non-transitory computer-readable storage media include, but are not limited to, volatile memory; non-volatile memory; electrical, magnetic, and optical storage devices such as disk drives, magnetic tape, CDs (compact discs) and DVDs (digital versatile discs or digital video discs), solid-state drives, and/or other non-transitory computer-readable media now known or later developed.

Methods and processes described in the detailed description can be embodied as code and/or data, which may be stored in a non-transitory computer-readable storage medium as described above. When a processor or computer system reads and executes the code and manipulates the data stored on the medium, the processor or computer system performs the methods and processes embodied as code and data structures and stored within the medium.

Furthermore, the methods and processes may be programmed into hardware modules such as, but not limited to, application-specific integrated circuit (ASIC) chips, field-programmable gate arrays (FPGAs), and other programmable-logic devices now known or hereafter developed. When such a hardware module is activated, it performs the methods and processes included within the module.

The foregoing embodiments have been presented for purposes of illustration and description only. They are not intended to be exhaustive or to limit this disclosure to the forms disclosed. Accordingly, many modifications and variations will be apparent to practitioners skilled in the art. The scope is defined by the appended claims, not the preceding disclosure.

What is claimed is:

1. A phased array using a phase-locked loop (PLL)-coupled structure, comprising:
    an array of unit cells, wherein each unit cell in the array of unit cells includes a radiating element;
    wherein each unit cell in the array of unit cells includes a PLL having a dual-nested structure that is configured to effectuate phase locking and frequency locking to a reference signal from an adjacent unit cell in the array;
    wherein each PLL includes a local voltage-controlled oscillator (VCO) that is phase locked and frequency locked with an adjacent VCO in an adjacent PLL in an adjacent unit cell in the array of unit cells; and
    wherein each PLL includes control circuitry that controls a phase shift between the local VCO and the adjacent VCO to facilitate phased-array operations.

2. The phased array of claim 1, wherein the dual-nested structure in each PLL in each unit cell includes:
    a fast loop that provides frequency locking between the local VCO and the adjacent VCO; and
    a slow loop that provides phase locking between the local VCO and the adjacent VCO.

3. The phased array of claim 2, wherein the slow loop includes adjustable delay circuitry that generates the phase shift between the local VCO and the adjacent VCO based on a control voltage.

4. The phased array of claim 3, wherein using the adjustable delay circuitry in the dual-nested PLL to generate the phase shift eliminates using a conventional phase shifter in the unit cell.

5. The phased array of claim 2, wherein the slow loop includes a mixer which is coupled between the local VCO and the adjacent VCO, and functions as a phase/frequency detector that measures a phase difference between the local VCO and the adjacent VCO.

6. The phased array of claim 5, wherein the mixer is configured with a symmetrical topology for receiving differential signals from both the local VCO and the adjacent VCO, thereby avoiding long signal routings to the mixer at high operating frequencies.

7. The phased array of claim 1, further comprising a reference VCO coupled to the array of unit cells to provide a frequency reference for all unit cells in the array of unit cells based on an external DC control signal that controls the reference VCO.

8. The phased array of claim 1, wherein the array of unit cells comprises a two-dimensional array of unit cells.

9. The phased array of claim 8,
    wherein the two-dimensional array of unit cells includes a first row of unit cells arranged along an X-direction; and
    wherein each unit cell in the first row of unit cells receives a first control voltage that controls a first phase shift between a first VCO of a first PLL and a second VCO of a second PLL within a pair of adjacent unit cells in the first row of unit cells, and wherein the first phase shift determines a first radiation angel for the radiating elements in the first row of unit cells in the X-direction.

10. The phased array of claim 9, wherein the first control voltage is applied to the adjustable delay circuitry within each of the first row of unit cells.

11. The phased array of claim 9,
    wherein the two-dimensional array of unit cells additionally includes a second row of unit cells arranged along the X-direction; and
    wherein the first row of unit cells and the second row of unit cells are coupled through a coupling unit cell located at an end of the second row of unit cells.

12. The phased array of claim 11,
    wherein each unit cell in the first row of unit cells and a corresponding unit cell in the second row of unit cells are aligned along a Y-direction perpendicular to the X-direction; and
    wherein the coupling unit cell receives a second control voltage which controls a second phase shift between the first row of unit cells and the second row of unit cells, and wherein the second phase shift determines a second radiation angel for the radiating elements in both the first and second rows of unit cells in the Y-direction.

13. The phased array of claim 12, wherein the second control voltage is applied to the adjustable delay circuitry within the coupling unit cell.

14. The phased array of claim 12, wherein each unit cell other than the coupling unit cell in the second row of unit cells receives the first control voltage which determines the first radiation angel for the second row of unit cells in the X-direction.

15. The phased array of claim 1, wherein unit cells in the array of unit cells are continuously coupled to each other through the PLL of each unit cell in the array of unit cells, and wherein the continuously-coupled PLLs in the array of unit cells form a PLL-coupled structure.

* * * * *